United States Patent
Sakai et al.

(10) Patent No.: US 7,834,627 B2
(45) Date of Patent: Nov. 16, 2010

(54) NMR MEASUREMENT SYSTEM AND NMR IMAGE PROCESSING SYSTEM FOR NEURAL FIBER BUNDLES WITH VOLUME OF INTEREST (VOI) OPTIMIZATION

(75) Inventors: Kuniyoshi L. Sakai, Tokyo (JP); Yukari Yamamoto, Kunitachi (JP)

(73) Assignees: Hitachi, Ltd., Tokyo (JP); The University of Tokyo, Tokyo (JP)

( * ) Notice: Subject to any disclaimer, the term of this patent is extended or adjusted under 35 U.S.C. 154(b) by 332 days.

(21) Appl. No.: 11/987,083

(22) Filed: Nov. 27, 2007

(65) Prior Publication Data

US 2008/0122440 A1    May 29, 2008

(30) Foreign Application Priority Data

Nov. 27, 2006 (JP) ............................. 2006-318981

(51) Int. Cl.
   *G01V 3/00* (2006.01)
(52) U.S. Cl. ........................................ 324/318; 324/307
(58) Field of Classification Search ......... 324/300–322; 600/410, 411, 422
   See application file for complete search history.

(56) References Cited

U.S. PATENT DOCUMENTS

| | | | |
|---|---|---|---|
| 6,526,305 B1 * | 2/2003 | Mori ........................... | 600/410 |
| 6,724,190 B2 * | 4/2004 | van Muiswinkel et al. .. | 324/307 |
| 6,806,705 B2 * | 10/2004 | van Muiswinkel et al. .. | 324/307 |
| 7,268,551 B2 * | 9/2007 | Lange ......................... | 324/318 |
| 7,355,597 B2 * | 4/2008 | Laidlaw et al. .............. | 345/419 |

(Continued)

FOREIGN PATENT DOCUMENTS

JP    11-000320    6/1997

OTHER PUBLICATIONS

S. Mori et al., "3D Reconstruction of Axonal Fibers from Diffusion Tensor Imaging Using Fiber Assignment by Continuous Tracking (FACT)" Proc. Intl. Soc. Magn, Reson. Med., vol. 7 (1999). p. 320.

(Continued)

*Primary Examiner*—Brij B. Shrivastav
*Assistant Examiner*—Tiffany A Fetzner
(74) *Attorney, Agent, or Firm*—Stites & Harbison, PLLC; Juan Carlos A. Marquez, Esq.

(57) ABSTRACT

The present invention provides a measurement system and an image processing system for quantitatively figuring out the fiber bundles which are passing through any VOI. A static magnetic field and an RF signal are applied to a subject, and a nuclear magnetic resonance signal is received from the subject (401). Diffusion tensor is calculated from the nuclear magnetic resonance signals (402). As to a target area for receiving the nuclear magnetic resonance signal from the subject, fiber bundles passing through multiple predetermined origins, respectively, are extracted in a form of a group of coordinate points for each of the fiber bundles, based on the diffusion tensor calculated by the calculating means (406). At least one VOI is set for the target area for receiving the nuclear magnetic resonance signal (408). Out of the multiple fiber bundles extracted by the fiber bundle extracting means, the fiber bundles having at least one coordinate point of the group of coordinate points being included in the VOI are discriminated and the number of which is counted (409).

6 Claims, 18 Drawing Sheets

U.S. PATENT DOCUMENTS

| | | | |
|---|---|---|---|
| 7,505,806 B2* | 3/2009 | Masutani et al. | 324/307 |
| 7,570,049 B2* | 8/2009 | Lange | 324/307 |
| 7,657,071 B2* | 2/2010 | Bartesaghi et al. | 382/128 |
| 2003/0214289 A1* | 11/2003 | van Muiswinkel et al. | 324/307 |
| 2003/0214290 A1* | 11/2003 | van Muiswinkel et al. | 324/307 |
| 2003/0234781 A1* | 12/2003 | Laidlaw et al. | 345/419 |
| 2005/0101857 A1* | 5/2005 | Masutani et al. | 600/410 |
| 2005/0240097 A1* | 10/2005 | Lange | 600/410 |
| 2006/0229856 A1* | 10/2006 | Burrus et al. | 703/11 |
| 2006/0281987 A1* | 12/2006 | Bartesaghi et al. | 600/410 |
| 2007/0273373 A1* | 11/2007 | Lange | 324/307 |
| 2008/0122440 A1* | 5/2008 | Sakai et al. | 324/309 |
| 2008/0180097 A1* | 7/2008 | Kanda | 324/307 |
| 2008/0205733 A1* | 8/2008 | Laidlaw et al. | 382/131 |
| 2009/0232374 A1* | 9/2009 | Simon | 382/131 |
| 2010/0004527 A1* | 1/2010 | Dale et al. | 600/410 |

OTHER PUBLICATIONS

T.E.J. Behrens et al., "Characterization and Propagation of Uncertainty in Diffusion-Weighted MR Imaging", Magnetic Resonance in Medicine, vol. 50 (2003), pp. 1077-1088.

* cited by examiner

FIG.15

Comparison of value of evaluation function

| VOI | Radius of VOI | | | | |
|---|---|---|---|---|---|
| | 6 | 7 | 8 | 9 | 10 |
| (1) | 1.26 | 1.32 | 1.35 | 1.35 | 1.43 |
| (2) | 1.11 | 0.80 | 0.82 | 0.84 | 0.68 |
| (3) | 1.24 | 1.55 | 1.56 | 1.58 | 1.61 |
| (4) | 0.80 | 0.41 | 0.41 | 0.42 | 0.35 |

US 7,834,627 B2

NMR MEASUREMENT SYSTEM AND NMR IMAGE PROCESSING SYSTEM FOR NEURAL FIBER BUNDLES WITH VOLUME OF INTEREST (VOI) OPTIMIZATION

CLAIM OF PRIORITY

The present application claims priority from Japanese application JP 2006-318981 filed on Nov. 27, 2006, the content of which is hereby incorporated by reference into this application.

BACKGROUND OF THE INVENTION

1. Field of the Invention

The present invention relates to a measurement system and an information processing system using a nuclear magnetic resonance. More particularly, it relates to the measurement system and the image processing system that quantitatively evaluate neural fiber bundles being extracted based on diffusion tensor.

2. Description of the Related Art

In recent years, tractography has been developed, which represents a fiber bundle such as a white matter fiber, by utilizing a nuclear magnetic resonance imaging (hereinafter, referred to as "MRI"). This technique is now becoming established as a strong tool for a brain scientific research. In addition, this technique is expected to be applied to a diagnosis of lesion of the central nervous system, a preoperative examination of a brain surgical operation, and the like.

The tractography is based on a diffusion anisotropic measurement. In this measurement, MPGs (Motion Probing Gradient), being a gradient magnetic field that enhances a change of signal amount due to the molecular diffusion, is applied in at least seven directions so as to measure diffusion-weighted images, and diffusion tensor corresponding to each voxel of these diffusion-weighted images is calculated. In a fiber-like tissue such as a white matter made up of neural fibers, a direction in which the internal water molecules diffuse is restricted by the fiber, and this indicates anisotropy. Therefore, by using information of an eigenvalue and an eigenvector, which can be obtained by diagonalizing the diffusion tensor, a pixel having high diffusion anisotropy is sequentially traced along a direction in which a diffusion coefficient is maximized (a direction of the eigenvector having a maximum eigenvalue), thereby enabling an imaging of the fiber bundles. A technique for imaging the fiber bundles based on the diffusion tensor is described, for example, in the Japanese Unexamined Patent Application Publication No. 11000320, hereinafter referred to as "patent document 1", and in "PROCEEDINGS OF INTERNATIONAL SOCIETY OF MAGNETIC RESONANCE IN MEDICINE, 320 (1999)", hereinafter referred to as "non-patent document 1".

The fiber bundles are traced as the following; voxels included in any area on the diffusion tensor image are set as origins, and fiber bundles passing through respective origins are traced, and a series of image data constituting each fiber bundle is stored. The area for the voxels being the origins is referred to as a seed area. In selecting an area of interest, an operator may specify any position in a magnetic resonance image, by way of example. Alternatively, an area having high diffusion anisotropy may be extracted based on the diffusion tensor, a brain area extracted from a result of a brain functional measurement such as fMRI (functional magnetic resonance image) may be used, or a specific portion obtained from priori information may be used.

In the brain functional measurement such as the fMRI, a brain activated area associated with a particular impulse is created as an image. In order to understand functions of the brain, it is important to know anatomical connectivity between these brain activated areas. There is a method being used frequently, which displays a three-dimensional image of neural fiber bundles between the brain activated areas being obtained by the brain functional measurement, and visually evaluates the connectivity of each neural path. In many cases, in order to figure out a positional relationship between the area of interest within the brain and each neural path, data of the neural fiber bundles is displayed in superimposing manner on an anatomical image such as a nuclear magnetic image.

One of the methods to quantitatively evaluate the connectivity is described in "MAGNETIC RESONANCE IN MEDICINE, 1077-1088 (2003)", hereinafter, referred to as "non-patent document 2". In drawing the fiber bundles, there exists uncertainty due to a noise, artifact, incomplete modeling of diffusion signals, and the like. In this method, the above uncertainty is represented in the form of local probability density function based on the diffusion model, and by using this probability density function, a probability of existence of fiber bundle connection between any two points is estimated.

However, in the conventional method that displays the neural fiber bundle data in superimposing manner on the anatomical image, it is not possible to quantitatively figure out the neural fiber bundles. In the method to estimate the probability of existence of fiber bundle connection between any two points, as global connectivity by using the probability density function, it is not possible to compare the connectivity intensity between any of the neural paths, with others.

The present invention has been made to solve the problems shown in the conventional techniques as described above, and an object of the present invention is to provide a measurement system and an image processing system in which fiber bundles passing through any VOI (volume of interest) are quantitatively figured out.

SUMMARY OF THE INVENTION

In order to solve the above problem, according to a first aspect of the present invention, a measurement system as described below is provided. In other words, the measurement system includes, a magnetic field application means for applying a static magnetic field and a radio frequency field to a subject, a nuclear magnetic resonance signal receiving means for receiving a nuclear magnetic resonance signal from the subject, a calculating means for calculating diffusion tensor from the nuclear magnetic resonance signal, a fiber bundle extracting means for selecting seed areas confined to measurement area for the nuclear magnetic resonance signals from the subject, and for extracting fiber bundles by using the seed areas as starting points of the extraction based on the diffusion tensor calculated by the calculating means, and for keeping a group of coordinate points for each of the fiber bundles, a VOI selecting means for setting at least one VOI as to the target range for receiving the nuclear magnetic resonance signal, and a fiber bundle number discriminating means for discriminating the fiber bundles at least one coordinate point of the group of coordinate points of which is included in the VOI, from multiple fiber bundles extracted by the fiber bundle extracting means, and for counting the number of the fiber bundles. With the configuration above, it is possible to count the number of the fiber bundles passing through the VOI.

The VOI selecting means is capable of setting a VOI group including at least one VOI, and a discrimination condition that indicates what kind of neural path the fiber bundles to be discriminated are taking, when passing through at least one of the VOIs constituting the VOI group. The fiber bundle number discriminating means discriminates the fiber bundles and counts the number thereof as to the VOI group, according to the discrimination condition. Accordingly, it is possible to quantitatively figure out the connectivity in a predetermined neural path in the VOI group, in the form of the number of fiber bundles.

By way of example, the discrimination condition can be configured in such a manner as including a first condition in which the fiber bundles pass through at least one of two VOIs specified in the VOI group, a second condition in which the fiber bundles pass through both the two VOIs specified in the VOI group, and a third condition in which the fiber bundles do not pass through one VOI specified in the VOI group. The fiber bundle number discriminating means is capable of discriminating the fiber bundles satisfying the discrimination condition and count the number thereof as the following manner, when each of the above conditions is set; when the first condition is set, the fiber bundles having at least one coordinate point of the group of coordinate points that is included in at least either one of the two VOIs are discriminated and the number of which is counted; when the second condition is set, the fiber bundles having at least any of coordinate points of the group of coordinate points that are included in at least either one of the two VOIs and any other coordinate points of the same group of coordinate points being included in the other VOI are discriminated and the number of which is counted; and when the third condition is set, the fiber bundles whose coordinate points are included in the VOI being specified are discriminated and excluded from a target of counting.

The aforementioned VOI selecting means is capable of setting a combination condition of two or more of the first condition, the second condition, and the third condition, as to the VOI group including at least three VOIs. Accordingly, it is possible to discriminate the fiber bundles passing through a predetermined neural path.

When the VOI selecting means sets at least two VOIs or VOI groups, it is possible to compare the numbers of the fiber bundles counted with respect to each of the VOI and the VOI groups. Accordingly, the connectivity between at least two VOI groups can be compared.

When the numbers of fiber bundles are compared as to the VOIs or the VOI groups, a predetermined evaluation function value or a statistical analytic value is calculated for the comparison. As the evaluation function value, it is possible to employ a ratio between the number of fiber bundles being counted and the number of fiber bundles included in a predetermined background area. An area obtained by adding multiple VOIs can be used as the predetermined background area. A result of the comparison may be displayed on a display.

The aforementioned VOI selecting means is capable of arranging VOIs having various sizes respectively at multiple different positions, and allowing the fiber bundle number discriminating means to count each of the numbers of the fiber bundles respectively included in the VOIs of various sizes, and display the result on the display. Accordingly, by referring to the result being displayed, the operator is capable of determine a VOI having appropriate size. On this occasion, it is further possible that the VOI selecting means executes a predetermined computation as to the number of fiber bundles in the VOIs of various sizes, whereby an optimum range of the VOI size is obtained, and the obtained optimum range is displayed on a display.

According to the second aspect of the present invention, an image processing system as the following is provided. In other words, this image processing system includes a memory means for storing nuclear magnetic resonance signal data previously acquired from a subject, a calculating means for calculating diffusion tensor from the nuclear magnetic resonance signal data previously acquired, a fiber bundle extracting means for extracting fiber bundles as a group of coordinate points for each of the fiber bundles included in a target range for receiving a nuclear magnetic resonance signal from the subject, based on the diffusion tensor calculated by the calculating means, a VOI selecting means for setting at least one VOI as to the target range for receiving the nuclear magnetic resonance signal, and a fiber bundle number discriminating means for discriminating the fiber bundles at least one coordinate point of the group of coordinate points of which is included in the VOI, from multiple fiber bundles extracted by the fiber bundle extracting means, and for counting the number of the fiber bundles. Accordingly, it is possible to provide the image processing system that is capable of counting the number of fiber bundles, based on the nuclear magnetic resonance signal data acquired from a separate device. As for the operations of each of the elements above may be the same as those of the first embodiment.

According to the third aspect of the present invention, a program as the following is provided. In other words, it is an image processing program that allows a computer to function as a calculating means for calculating diffusion tensor from the nuclear magnetic resonance signal data previously acquired from a subject, a fiber bundle extracting means for extracting fiber bundles as a group of coordinate points for each of the fiber bundles included in a target range for receiving a nuclear magnetic resonance signal from the subject, based on the diffusion tensor calculated by the calculating means, a VOI selecting means for setting at least one VOI as to the target range for receiving the nuclear magnetic resonance signal, and a fiber bundle number discriminating means for discriminating the fiber bundles at least one coordinate point of the group of coordinate points of which is included in the VOI, from multiple fiber bundles extracted by the fiber bundle extracting means, and for counting the number of the fiber bundles. By allowing the computer to execute this program, an image processing similar to the second aspect of the invention can be implemented, and thereby the number of fiber bundles can be quantitatively figured out.

According to the measurement system and the image processing system of the present invention, the following effects can be achieved:

(1) At least one VOI is set and the number of fiber bundles included in the VOI can be discriminated;

(2) Since it is possible to make a comparison as to the number of fiber bundles included in each of multiple VOIs, the connectivity of the fiber bundles respectively passing through the multiple VOIs can be quantitatively compared;

(3) Since it is possible to make a comparison as to the number of fiber bundles included in each of multiple VOI groups each made up of multiple VOIs, the connectivity of the fiber bundles respectively passing through the multiple VOI groups can be quantitatively compared;

(4) Since a value of relative evaluation function can be used as the connectivity of the fiber bundles, the connectivity can be quantitatively compared with one another, without any influence from an individual difference in the degree of the fiber bundle development;

(5) If the VOIs having the same size are targeted for comparison, the connectivity of the fiber bundles can be compared, under the condition that the number of fiber bundles is not changed due to a difference of volume of the VOI;

(6) It is possible to make a comparison as to the number of fiber bundles in the VOIs having multiple sizes, and by referring to a result of the comparison, an optimum size of the VOI can be selected; and (7) Since the information of the comparison result obtained by the comparator is displayed on the display, it is possible to display a result that is obtained by quantitatively comparing the connectivity of the fiber bundles included in multiple VOIs or in multiple VOI groups.

BRIEF DESCRIPTION OF THE DRAWINGS

FIG. 15 illustrates a screen example of the numerical table that represents an evaluation function value with respect to each VOI radius, in the measurement system according to the second embodiment;

DESCRIPTION OF THE PREFERRED EMBODIMENTS

Hereinafter, preferred embodiments of the present invention will be explained with reference to the accompanying drawings. It is to be noted these embodiments here described will not restrict the scope of the present invention.

First Embodiment

Figure 1:
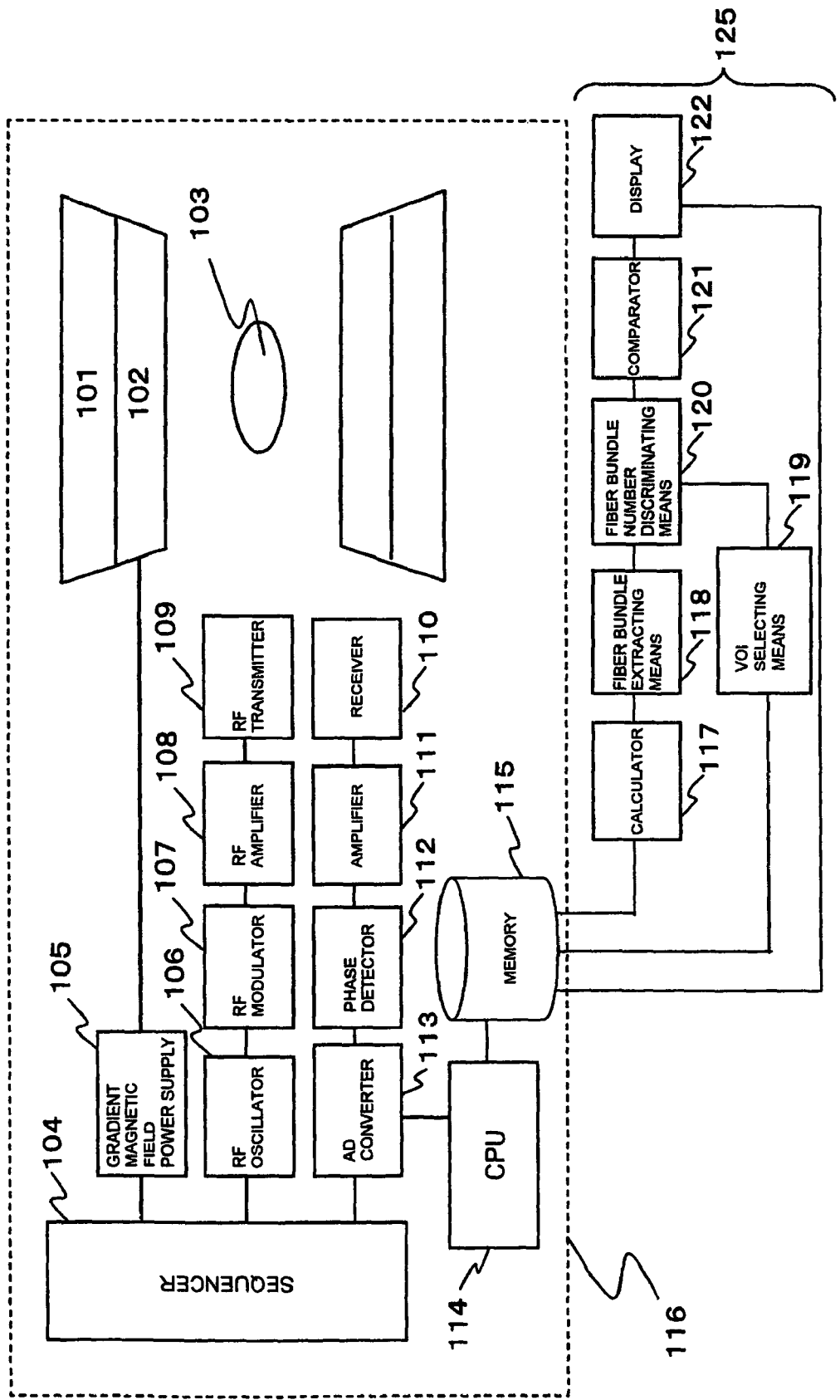
FIG. 1 is a block diagram showing an overall configuration of the measurement system relating to the first embodiment.

The measurement system of the present invention as a first embodiment will be explained. This measurement system includes a nuclear magnetic resonance imager 116 and an image processing means 125, and the configuration incorporating these elements is shown in FIG. 1.

The nuclear magnetic resonance imager 116 is provided with a coil 101 for generating a static magnetic field in an imaging space in which a subject 103 is placed, a coil 102 for generating a gradient magnetic field, an RF transmitter 109 for transmitting an RF magnetic field to the subject 103, and the receiver 110 for receiving the nuclear magnetic resonance signal generated from the subject 103.

A gradient magnetic field power supply 105 is connected to the gradient magnetic field coil 102. An RF amplifier 108, an RF modulator 107, and an RF oscillator 106 are connected to the RF transmitter 109. A high frequency wave generated by the RF oscillator 106 is modulated to a predetermined frequency by the RF modulator 107, and amplified by the RF amplifier 108. Thereafter, it is supplied to the RF transmitter 109 and a given RF magnetic field is irradiated to the subject 103. An amplifier 111, a phase detector 112, and an A/D converter 113 are connected to the receiver 110. A nuclear magnetic resonance signal generated from the subject is converted into an electrical signal by the receiver 110, and thereafter, amplified by the amplifier 111, and detected by the phase detector 112. Then, the signal is converted into a digital signal by the A/D converter 113.

The nuclear magnetic resonance imager 116 is provided with a CPU 114, a sequencer 104, and a memory 115. The sequencer 104 activates the gradient magnetic field power supply 105 and the RF oscillator 106 at a specified timing and allows the A/D converter 113 and the phase detector 112 to perform detection, whereby a predetermined imaging pulse sequence directed by the CPU 114 is executed. In this example here, neural fiber bundles are extracted by using diffusion tensor in the image processing means 125. Therefore, an imaging pulse sequence for acquiring a diffusion-weighted image is executed.

The CPU 114 receives an output signal from the A/D converter 113, and performs a signal processing such as an image reconstruction, and thereby, a desired reconstructed image of the subject 103, such as a nuclear magnetic resonance image (e.g., a tomographic image) is obtained according to the nuclear magnetic resonance signal. The nuclear magnetic resonance signal and the nuclear magnetic resonance image are stored in the memory 115, as necessary.

On the other hand, the image processing means 125 is provided with a calculator 117, a fiber bundle extracting means 118, a fiber bundle number discriminating means 120, a comparator 121, a display 122, and a VOI selecting means 119.

The calculator 117 calculates the diffusion tensor from the nuclear magnetic resonance image obtained by a series of measurements, and further by diagonalizing the diffusion tensor, an eigenvalue and an eigenvector are calculated. The fiber bundle extracting means 118 receives from an operator, a specification of a seed area within a target range from where the nuclear magnetic resonance image of the subject is acquired. Then, using one voxel within the seed area as an origin, voxels positioned in the direction where the diffusion coefficient is the largest according to the information of the eigenvector, i.e., in the direction of a principal vector of the fiber bundle, are sequentially traced in a nuclear magnetic resonance image. Therefore, a series of voxels (i.e., a group of coordinate points) constituting one fiber bundle can be extracted. The operation above is performed by setting as an origin, each of all the voxels or multiple voxels selected according to a certain condition within the seed area, whereby all the fiber bundles passing through the seed area can be extracted, as a group of coordinate points with respect to each of the fiber bundles. The fiber bundle extracting means 118 records a series of coordinate points being extracted, in the built-in memory.

The VOI selecting means 119 sets at least one VOI specified by the operator, within the range for acquiring the nuclear magnetic resonance image of the subject 103. In the fiber bundle number discriminating means 120, the group of coordinate points constituting one fiber bundle is compared with the coordinate range of the VOI. Then, it is determined whether or not at least one coordinate of the coordinate point group is included in the coordinate range of the VOI. If it is included, this one fiber bundle is determined as a fiber bundle that passes through the VOI. This determination is made with respect to all the fiber bundles recorded by the fiber bundle extracting means 118. After the determinations are made as to all the fiber bundles, the number of the fiber bundles included in the VOI is counted. If multiple VOIs are set in the VOI selecting means 119, the fiber bundles included in these VOIs are discriminated with respect to each VOI, and the number of fiber bundles is counted. In the comparator 121, if multiple VOIs are set in the VOI selecting means 119, the numbers of fiber bundles included in each of those multiple VOIs are compared as needed, and a result of the comparison is displayed on the display 122. Further on the display 122, an image of the fiber bundles is generated by representing a series of voxels (a group of coordinate points) constituting the fiber bundles, in a given color, and it is displayed with the nuclear magnetic resonance image, and the like, in superimposed manner one on another.

It is to be noted that the image reconstruction can be executed by the calculator 117 of the image processor 125, instead of executing the image reconstruction by the CPU 114 of the nuclear magnetic resonance imager 116. In the case above, the image reconstruction is not performed in the CPU 114, and the nuclear magnetic resonance signal is stored in the memory means 115. The nuclear magnetic resonance signal being stored is transferred to the calculator 117, and the image reconstruction is performed in the calculator 117.

Figure 2:
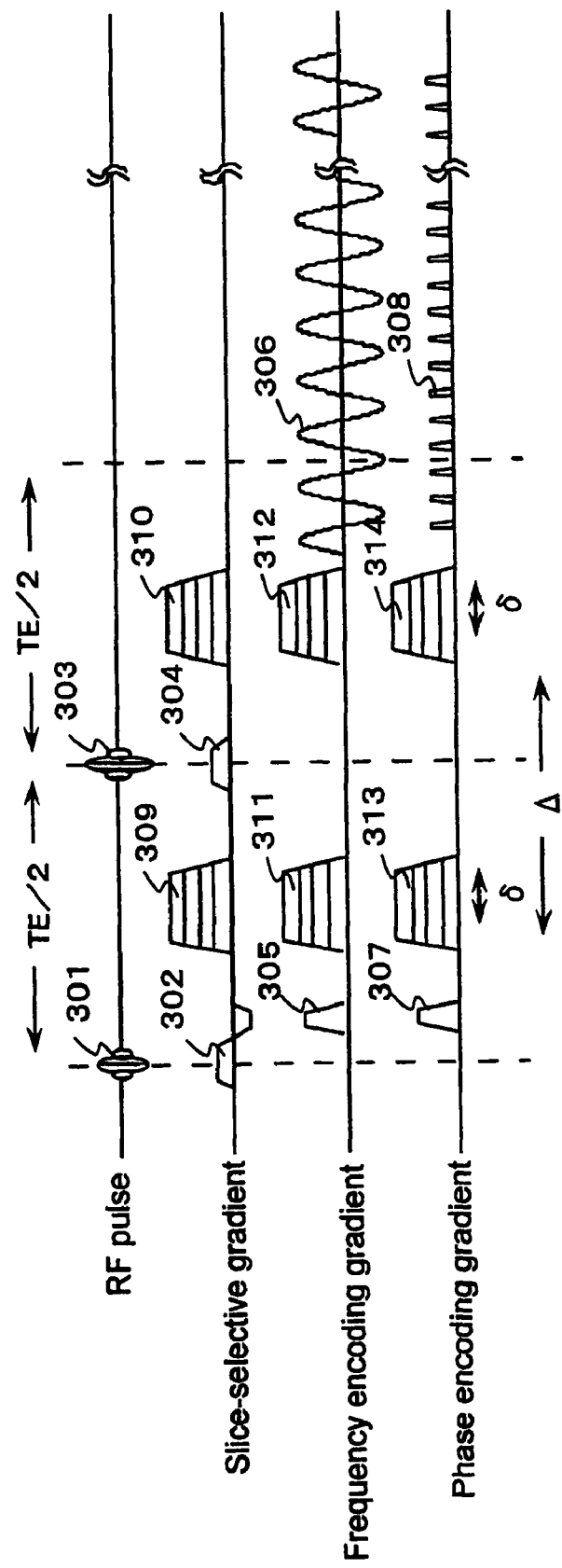
FIG. 2 illustrates an example of the pulse sequence executed in the measurement system according to the first embodiment.

Next, as an imaging pulse sequence for acquiring a diffusion-weighted image, a pulse sequence according to a diffusion-weighted echo-planar will be explained with reference to FIG. 2. As shown in FIG. 2, while applying the first slice-selective gradient magnetic field 302, the first slice-selective RF pulse 301 is irradiated. After a lapse of time TE/2, the second slice-selective RF pulse 303 is irradiated, while applying the second slice-selective gradient magnetic field 304. After additional lapse of time TE/2 after the second slice-selective RF pulse 303, a spin echo is generated. On this occasion, a multi-echo is generated by applying the frequency encoding gradient magnetic field 306 with repetition of reversing the polarities, and the multiple echoes are detected. By applying a blipped phase encoding gradient magnetic field 308 in synchronization with the frequency encoding gradient magnetic field 306, the phase encoding is performed.

Before and after the application of inverse RF pulses 301 and 303, a gradient magnetic field (motion probing gradient, MPG) pulse for detecting a spin motion is applied, in a slice direction, a readout direction, and a phase encoding direction. Pulse 309 represents a first MPG in the slice direction, pulse 310 represents a second MPG in the slice direction, pulse 311 represents a first MPG in the readout direction, pulse 312 is a second MPG in the readout direction, pulse 313 represents a first MPG in the phase encoding direction, and pulse 314 represents a second MPG in the phase encoding direction. The first MPG and the second MPG in each of the directions have the same gradient waveform. FIG. 2 shows an example that the MPGs in each of the directions are applied simultaneously. However, they are not necessarily applied simultaneously in the respective directions. It is also possible to apply the MPG in any one of the directions only or simultaneously in multiple directions. It is also to be noted that when the MPGs are simultaneously applied in the multiple directions, the gradient waveforms of the MPG in the multiple directions do not necessarily coincide with one another.

In order to obtain a diffusion coefficient within the subject according to the pulse sequence shown in FIG. 2, the gradient magnetic field intensity in each of the first and the second MPGs 309 to 314 is changed, and measurement is performed more than once. As described below, in order to obtain the diffusion tensor, as to an identical slice, at least six nuclear magnetic resonance images using a combination of different MPGs, and a nuclear magnetic resonance image obtained without applying any MPG are necessary. In order to obtain those images, pulse sequences which perform measurement while changing the MPGs are executed. In addition, by executing the pulse sequence as shown in FIG. 2 while changing a transmission frequency of the first slice-selective RF pulse 301, it is possible to obtain nuclear magnetic resonance image of a different slice.

It is to be noted that in the pulse sequence as shown in FIG. 2, the gradient magnetic field pulse 305 represents a dephasing gradient magnetic field in the readout direction, and the gradient magnetic field pulse 307 represents a dephasing gradient magnetic field in the phase encoding direction. Some scanning methods may not need the dephasing gradient magnetic field 307 in the phase encoding direction. There is also a possibility to use continuous rectangular pulses instead of the blipped pulses, as the phase encoding gradient magnetic field 308.

Here, a principle of a method will be briefly explained, so as to obtain a diffusion coefficient from the nuclear magnetic resonance image. Signal attenuation according to the MPG is exponential as shown in the formula 1.

$$S(b)/S(0) = \exp(-bD) \qquad \text{[FORMULA 1]}$$

In this formula, S(b) represents signal intensity at the time of applying the MPG, S(0) represents signal intensity without the MPG, and D represents a diffusion coefficient. Here, b represents b-factor representing a degree of the signal attenuation according to the MPG, and it is obtained by the formula 2. Here, TE represents an echo time, $\gamma$ represents a gyromagnetic ratio, and $G(\tau)$ represents gradient magnetic field intensity.

$$b = \int_0^{TE} \gamma^2 \left| \int_0^t G(\tau) d\tau \right|^2 dt \quad \text{[FORMULA 2]}$$

In the diffusion anisotropic measurement, the diffusion coefficient D represents a tensor quantity as shown in the formula 3, and it is referred to as diffusion tensor. Since the number of independent elements of the tensor is six, in order to obtain the diffusion tensor, at least six nuclear magnetic resonance images using a combination of different MPGs and a nuclear magnetic resonance image obtained without applying the MPGs are necessary as to an identical slice. Each element of the diffusion tensor functions as a component of the diffusion coefficients being different by direction.

$$\overline{D} = \begin{pmatrix} D_{xx} & D_{xy} & D_{zx} \\ D_{xy} & D_{yy} & D_{yz} \\ D_{zx} & D_{yz} & D_{zz} \end{pmatrix} \quad \text{[FORMULA 3]}$$

The coordinate system based on a principal axis of the diffusion tensor is different from the observational coordinate system based on an imaging axis of MRI. Therefore, it is necessary to conduct a coordinate conversion. Therefore, the diffusion tensor obtained from the above measured value is diagonalized and eigenvalues $\lambda 1$, $\lambda 2$, and $\lambda 3$ are calculated. Then, the diffusion tensor having been diagonalized is obtained (formula 4).

$$\overline{D}' = \begin{pmatrix} \lambda_1 & 0 & 0 \\ 0 & \lambda_2 & 0 \\ 0 & 0 & \lambda_3 \end{pmatrix} \quad \text{[FORMULA 4]}$$

A coordinate system after the conversion is expressed by the eigenvectors $\mu 1$, $\mu 2$, and $\mu 3$, respectively associated with their eigenvalues. Since the direction of the fiber bundle corresponds to the direction in which water molecules are the most active, the direction of the eigenvector (principal vector), where the eigenvalue becomes the maximum, agrees with the direction of the fiber bundle.

As an index value indicating the level of the diffusion anisotropy, the fractional anisotropy (FA value) expressed by the formula 5 is utilized. The FA value is an index representing a deviance from the isotropic diffusion, and if it is completely isotropic, the index becomes zero. As the anisotropy is increased, the index is approaching 1 (one). In the area where fibers exist, such as a white matter within a brain, the diffusing direction of the water molecules within a tissue is restricted by the fibers. Therefore, the FA value becomes larger. On the other hand, in the area where no fibers exist, such as a gray matter, the FA value becomes smaller.

$$FA = \sqrt{\frac{3}{2} \sum_{i=1}^{3} (\lambda_i - \overline{\lambda})^2 \Big/ \sum_{i=1}^{3} \lambda_i^2} \quad \text{[FORMULA 5]}$$

Figure 3:
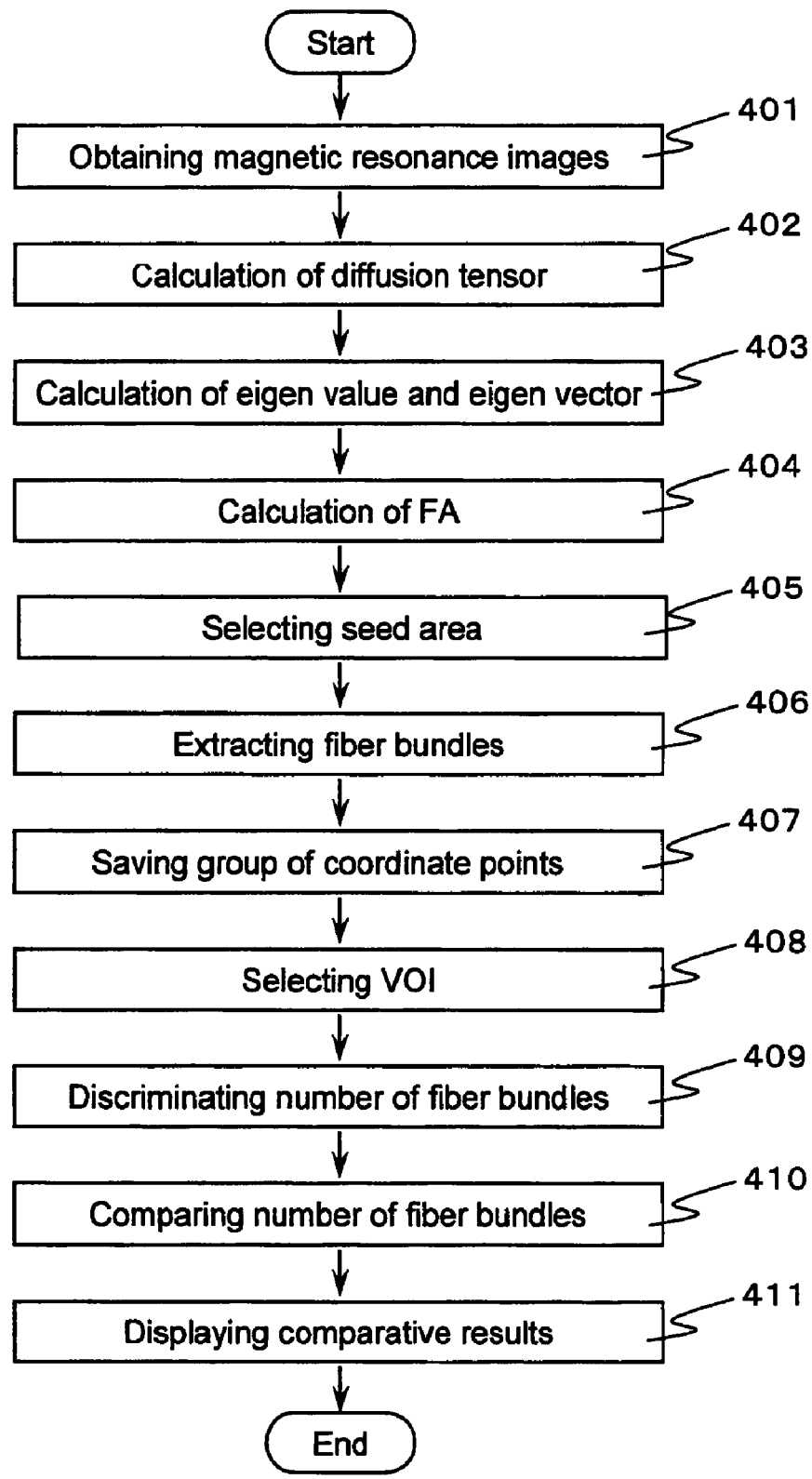
FIG. 3 is a flowchart showing operations of the measurement system according to the first embodiment.

In the measurement system according to the present embodiment, the fiber bundles are extracted by using the eigenvector and FA value obtained according to the formulas described above. Hereinafter, by using the flow as shown in FIG. 3, operations of the measurement system according to the present invention will be explained.

Firstly, the nuclear magnetic resonance imager 116 executes the pulse sequence as shown in FIG. 2, whereby at least six nuclear magnetic resonance images using a combination of different MPGs 309 to 314, and a nuclear magnetic resonance image obtained without applying the MPG are acquired as to one slice (step 401). Those at least seven nuclear magnetic resonance images are acquired with respect to each of the multiple slices being desired. Accordingly, as to a three-dimensional space, it is possible to obtain at least six MPG-applied nuclear magnetic resonance images each having a different combination of MPGs, and an MPG-non-applied nuclear magnetic resonance image. The number of slices being imaged is determined, considering a size and the like of an area where the extraction-target fiber bundles exist. The nuclear magnetic resonance images being acquired are subjected to the spatial transformation to the standard brain coordinate as necessary. The standard brain being employed may be, for example, the standard brain of Montreal Neurological Institute (MNI) or the standard brain of Talairach.

The calculator 117 calculates the diffusion tensor based on the formula 3 with respect to each voxel, from at least seven nuclear magnetic resonance images as to each slice (step 402). Subsequently, the diffusion tensor obtained for each voxel is diagonalized, and simultaneously eigenvalues and eigenvectors are calculated (step 403). The eigenvalues obtained here represent diffusion coefficients in three orthogonal directions. The directions of the eigenvectors respectively agree with the three orthogonal directions, and one of the directions indicates a direction of the fiber bundle. Since the direction of the fiber bundle corresponds to the direction in which water molecules are the most active, the direction of the eigenvector (principal vector), in which the eigenvalue becomes the maximum, agrees with the direction of the fiber bundle. The calculator 117 calculates the FA value from the eigenvalues as necessary (step 404). An appropriate threshold value is set, and by extracting an area where the FA value exceeds this threshold value, an area where the fiber bundles exist can be extracted. Here, it is assumed that the threshold value is set to be 0.6, by way of example.

Next, the fiber bundle extracting means 118 accepts from an operator, any specification of a seed area (step 405). As a method for specifying the seed area, for example, the operator selects any area by using a pointing device, or the like on the nuclear magnetic resonance image. Alternatively, if the spatial transformation to the standard brain coordinate has been conducted, a coordinate value or a combination of coordinate values of the standard brain coordinate system may be specified based on a priori knowledge. In the case where the measurement is performed targeting a brain, the operator may select a brain activated area that is obtained by a brain functional measuring method such as fMRI (functional magnetic resonance imaging). An alternative configuration is possible such as extracting an area by a threshold process using the FA value obtained in step 404, and selecting this area. Furthermore, the operator may select any area using a pointing device, from the multiple areas being extracted, or select from the extracted area, a coordinate value or a combination of coordinate values of the standard brain coordinate system based on a priori knowledge.

Next, the fiber bundle extracting means 118 extracts a fiber bundle, setting one voxel as a starting point for calculation among the voxels included in the seed area (step 406). In other words, in the case where the FA value at the origin (the FA value obtained in step 404) exceeds a given threshold value, and an adjacent voxel in the direction of the principal vector of the origin (i.e., the eigenvector obtained in step 403) exists within the image data space, the adjacent voxel in the direction of the principal vector is assumed as a coordinate point (voxel) along the fiber bundle and this coordinate point is traced. With regard to this adjacent voxel, when the FA value exceeds a given threshold value and another adjacent voxel in the principal vector direction exists in the image data space, this second adjacent voxel in the principal vector direction is assumed as a coordinate point (voxel) along the fiber bundle, and this second adjacent voxel is traced. The operation above is repeated until reaching a voxel where the FA value becomes equal to or less than the given threshold value, or until the adjacent voxel in the principal vector direction goes out of the image data space. A group of coordinate points obtained as a result of the tracing is recorded in the built-in memory (step 407). The operations in steps 406 and 407 are performed for all the voxels included in the seed area. Accordingly, all the fiber bundles passing through the seed area can be extracted.

Next, the VOI selecting means 119 accepts from the operator a setting of VOI (step 408). A shape of the VOI may be a sphere, a rectangular solid, or the like. It is also possible to set a "VOI group" that incorporates multiple VOIs. The VOI selecting means 119 also accepts from the operator a setting of the discriminating conditions as the following, under which the fiber bundle number discriminating means 120 discriminates the fiber bundles; the condition (AND) that the fiber bundles pass through both two VOIs, the condition (OR) that the fiber bundles pass through either one of the two VOIs, and the condition (NOT) that the fiber bundles passing through the VOI is excluded.

Figure 4:
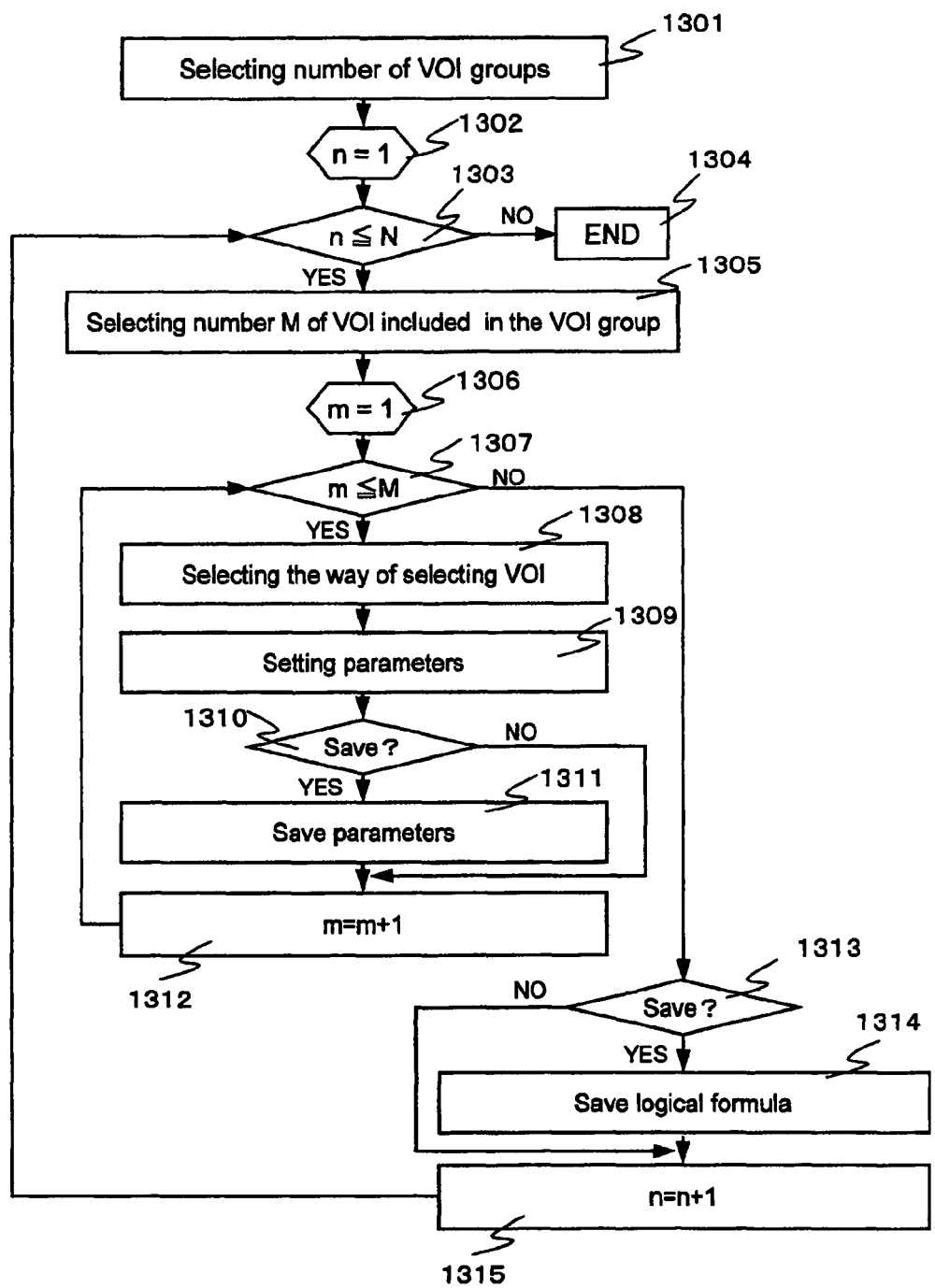
FIG. 4 is a flowchart showing details of the operation for specifying a VOI in step 408 shown in FIG. 3.
Figure 5:
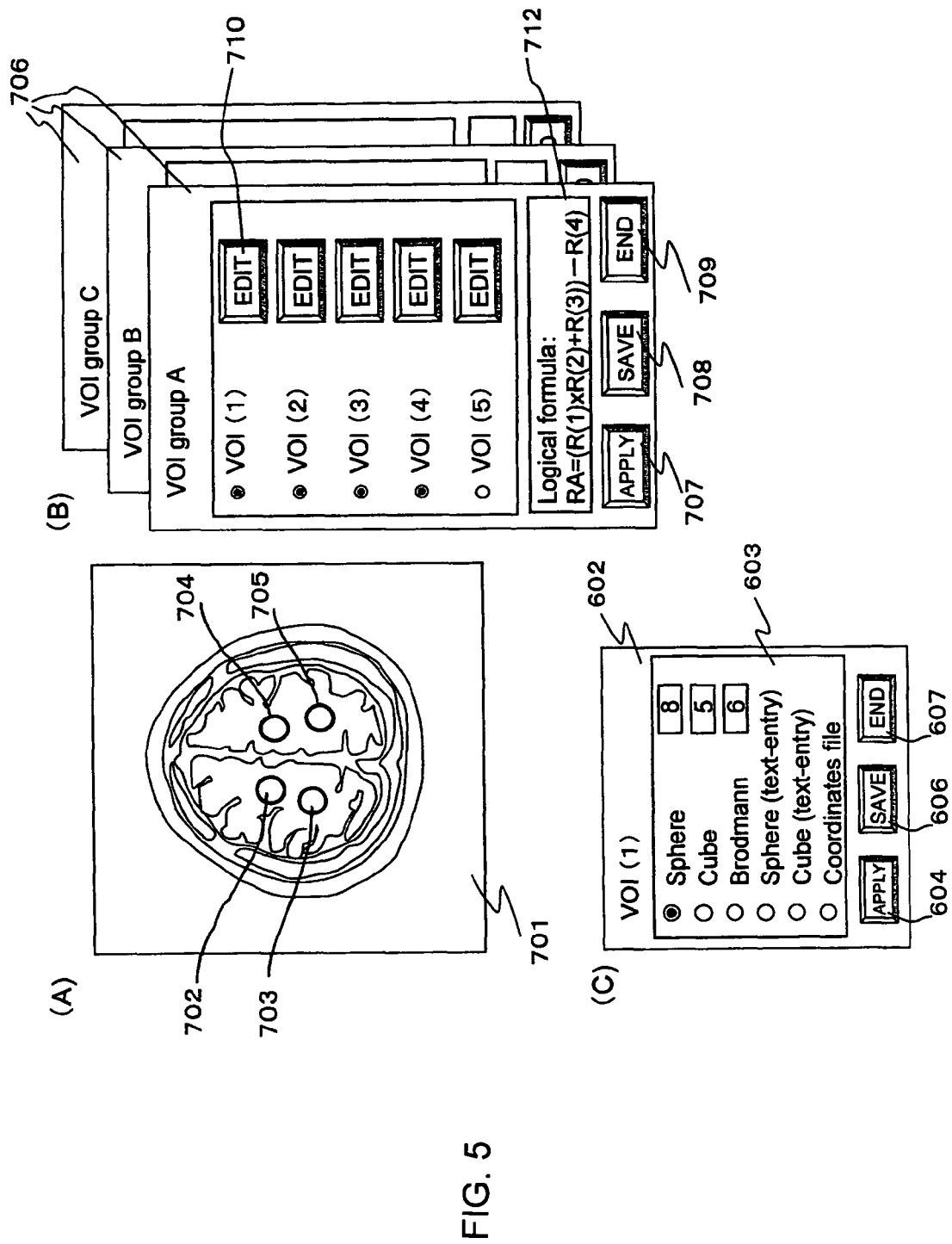
FIG. 5A, FIG. 5B, and FIG. 5c illustrate screen examples that the VOI selecting means 119 displays on the display 122, in the measurement system according to the first embodiment.

An operation in step 408 of the VOI selecting means 119 will be specifically explained with reference to the flowchart in FIG. 4, and display example as shown in FIGS. 5A, 5B, 5C, 6A and 6B. The VOI selecting means 119 displays an image display part 701 and an operation screen 706 on the screen of the display 122 as shown in FIG. 5A. The image display part 701 displays an image such as a nuclear magnetic resonance image taken by the nuclear magnetic resonance imager 116 as shown in FIG. 5A. The VOI selecting means 119 firstly displays a picture to accept a setting of the number of the VOI groups, and accepts from an operator via input means or the like, not illustrated, an operation to set a desired number N of the VOI groups (step 1301 of FIG. 4). If the VOI group is not set, the operator inputs N=1, assuming the number of the VOI group as N. FIG. 5B is an example in which the operator inputs N=3, as the number of the VOI groups, and the operation screens 706 are displayed respectively for the three VOI groups A, B, and C.

Next, in each of the operation screens 706, the operator sets the number M of VOIs, which is at least one, to be included in the VOI group (VOI group A in the example of FIG. 5B) (step 1305). In the example of FIG. 5B, four circles on the left side of the displayed items "VOI 1 to VOI 4" are reversed from white indication to black indication, indicating the blackened items are selected by the operator. When the operator selects "EDIT" button 710 that is arranged for each of the VOIs in the operation screen 706, by using a pointing device or the like, the operation screen 602 as shown in FIG. 5C is displayed. The operation screen 602 includes a VOI parameter input part 603, enabling selection of a method how to set the VOI (step 1308). As shown in FIG. 5C, the operation screen 602 is displayed with respect to each VOI. When the operator selects "SPHERE" or "CUBE" in the VOI parameter input part 603, a spherical area or a cubic area set by the operator on the image display part 701, using a pointing device or the like, is accepted as the VOI 702 (step 1309). When "BRODMANN" is selected, the Brodmann's map is displayed on the image display part 701, and any area set by the operator is accepted. When "SPHERE (Text Entry)" or "CUBE (Text Entry)" is selected, a spherical area or a cubic area is accepted, which is input by the operator in a text form from a different type of input means such as a keyboard. When "COORDINATE FILE" is selected, an action for specifying a coordinate file previously stored, which represents a group of coordinates constituting the VOI 605, is accepted from the operator. It is to be noted that the Brodmann's map is a map which divides a brain cortex into parts by function and specifies each address thereof, and associations between the addresses and the coordinates of the Talairach standard brain are already known.

When the operator specifies a spherical area or a cubic area by using a pointing device or the like, or specifies any area in the Brodmann's map, "APPLY" button 604 arranged in the operation screen 602 is pressed (i.e., selected by the pointing device, or the like), whereby the VOI 702 being specified is stored in the memory means within the VOI selecting means 119 (step 1310 and step 1311). By pressing "SAVE" button 606, a group of coordinates constituting the VOI can be stored in the memory means of the VOI selecting means 119.

Figure 6:
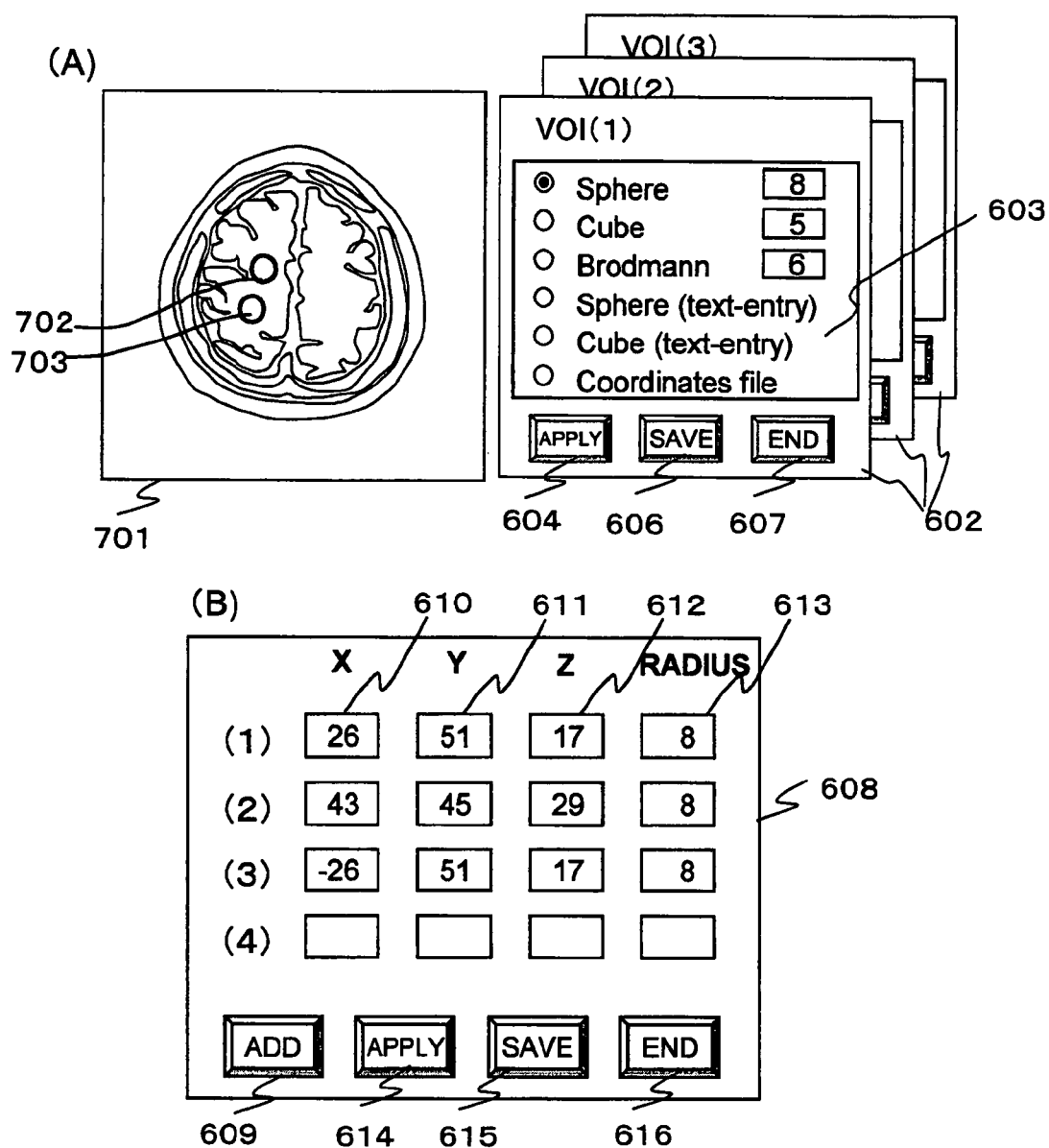
FIG. 6A and FIG. 6B illustrate screen examples that the VOI selecting means 119 displays on the display 122, in the measurement system according to the first embodiment.

When a spherical area, a cubic area, or the like, is selected via the aforementioned "SPHERE (Text Entry)" or "CUBE (Text Entry)", or the selection is made by using the aforementioned coordinate file, the "APPLY" button 604 is pressed, and then, a screen for inputting a text or a screen for selecting a coordinate file is displayed. FIG. 6B is an example of the text input screen 608. This text input screen 608 shows an example in which a spherical area is selected via the "SPHERE (Text Entry)". In the text input screen 608, when the "ADD" button 609 is pressed, a parameter input part for the VOI, as to which parameters are newly set, appears for each of the VOIs 605. The parameter input part is made up of, a part for inputting a central coordinate in the "X" direction 610, a part for inputting a central coordinate in the "Y" direction 611, a part for inputting a central coordinate in the "Z" direction 612, and a part for inputting "RADIUS" of the area 613. In this example here, the parameter input parts for four VOIs 605 are displayed. A numeric value is input into this parameter input part, in the form of text from a keyboard or the like, and thereafter the "APPLY" button 614 is pressed, whereby the VOI 605 having the specified coordinates and radius is set. When the "SAVE" button 615 is pressed, the combination of coordinates and the radius of the VOI 605 can be stored in the memory means that is incorporated in the VOI selecting means 119.

In the operation screen 602, when the "END" button 607 is pressed, the operation screen 602 for the VOI (1) is ended. As shown in FIG. 6A, the setting of the VOI using the operation screen 602 is performed for all of the VOIs, the number of which corresponds to the number M included in the VOI group A (step 1312, step 1306, and step 1307).

As shown in FIG. 5B, the operation screen 706 is provided with a logical formula input part 712. The logical formula input part 712 is a part for the operator to input in the form of logical formula, which represents a way desired by the operator how the fiber bundles pass through the VOI, the number of the fiber bundles being to be counted as to the VOI group A including M number of the VOIs 702 to 704. Specifically, this part accepts the logical formula input by the operator, assuming that the fiber bundles respectively passing through the VOIs 1, 2, 3, and 4 are represented by R(1), R(2), R(3), and R(4), and the condition (AND) for passing through both two VOIs is expressed by "×", the condition (OR) for passing through any one of the two VOIs is expressed by "+", and the condition (NOT) for excluding the fiber bundles passing through the VOI is expressed by "−". By way of example, if the number of fiber bundles to be counted satisfies the conditions; passing through both the VOI (1) and the VOI (2), or passing through the VOI (3) but the fiber bundle passing through the VOI (4) being excluded, the number of fiber bundles to be counted RA is expressed by the logical formula, RA=(R(1)×R(2)+R(3))−R(4). Therefore, the operator inputs this expression in the logical formula input part 712. As thus described, by accepting the input of the logical formula from the operator, it is possible to count the number of the fiber bundles passing through the neural path as to which the operator is curious to know. If the VOI is only one, inputting of the logical formula is not necessary, and the number of the fiber bundles passing through that VOI is counted.

When the operator inputs a logical formula into the logical formula input part 712 as appropriate, and selects "END" button 709, the VOI selecting means 119 stores the logical formula 712 in the built-in memory means (step 1313 and step 1314). The actions as described above are performed as to all the VOI groups (step 1315, step 1302, step 1303, and step 1304). The image display part 701 displays the VOIs. As for the display color of the VOIs, different colors may be respectively assigned to the VOI groups, thereby enabling an easy recognition of the VOI groups on the image.

In addition to the nuclear magnetic resonance image and Brodmann's map, as an image to be displayed on the image display part 701, it is possible to use another image such as an anatomical image obtained by X-ray CT (X-ray computed tomography) and the like, a brain functional image obtained by fMRI, PET (positron emission tomography), an electroencephalography, a magnetoencephalography, an optical measurement instrument for living body, SPECT (single photon emission computed tomography), or the like, and a standard brain model such as MNI and Talairach.

As the operation screen 602 for selecting the VOI, it is possible to have different operation screens for each of the VOIs 702 and 703 as shown in FIG. 6A. However, it is further possible to configure such that a VOI is specified from multiple VOIs on an identical operation screen. It is similarly possible that a VOI group is specified from multiple VOI groups on an identical operation screen. In the examples as shown in FIG. 6A and FIG. 6B, the operation screen 602 for selecting the VOI and the text input screen 608 are independent from each other, but it is further possible to configure such that the operation screen 602 for specifying the VOI is provided with the text input part. Similarly, it is also possible that the operation screen 602 for specifying the VOI is provided with the part for selecting the coordinate file.

Next, the operation proceeds with step 409 in FIG. 3, and in the fiber bundle number discriminating means 120, fiber bundles included in the VOI being specified are discriminated, and the number of fiber bundles satisfying the logical formula is counted. This operation will be explained with reference to the flows shown in FIG. 7 and FIG. 8.

The fiber bundle number discriminating means 120 discriminates the fiber bundles and counts the number thereof with respect to each VOI group. Firstly, the fiber bundle number discriminating means 120 receives from the fiber bundle extracting means 118, the number L of fiber bundles being extracted, simultaneously receives from the VOI selecting means 119, the number M of VOIs included in the VOI group A (here, M=4) (step 1401 and step 1405), and determines whether or not at least one of the coordinate points that define the first fiber bundle (l=1) is included in the VOI (1) (step 1409). If it is included, it is determined that the first fiber bundle is included in the VOI (1), and the number "1" is assigned to R(1) (R(1)=1) (step 1411). If it is not included, R(1) is set to zero (step 1410). Next, it is determined whether or not this first fiber bundle is included in the VOI (2) (step 1412, 1409). If it is included, R(2) is set to one, and if it is not included R(2) is set to zero (step 1411 and step 1410). The operation above is repeated as to all the VOIs (1) to (4) in the VOI group A, and R(1) to R(4) are obtained (step 1406 and step 1407). Thereafter, the operation proceeds with step 1415 in FIG. 8.

In step 1415, the logical formula is read, which is input in the operation screen 706 of the VOI group A, from the memory means of the VOI selecting means 119, the logical formula being RA=(R(1)×R(2)+R(3)−R(4)) in FIG. 5(B), for example (step 1416). It is checked whether or not the first fiber bundle satisfies this logical formula. In other words, the values of R(1) to R(4), being 1 or 0, which are obtained in step 1405 to 1412 above are substituted into the logical formula, and the value of RA is obtained (step 1417). If RA is a value larger than zero, the first fiber bundle satisfies the condition defined by the logical formula, for example, the fiber bundle passes through both the VOI (1) and the VOI (2), or it passes through the VOI (3), and the fiber bundle passing through the VOI (4) is excluded. Therefore, the number of the fiber bundles is counted up (step 1418 and step 1419).

Figure 7:
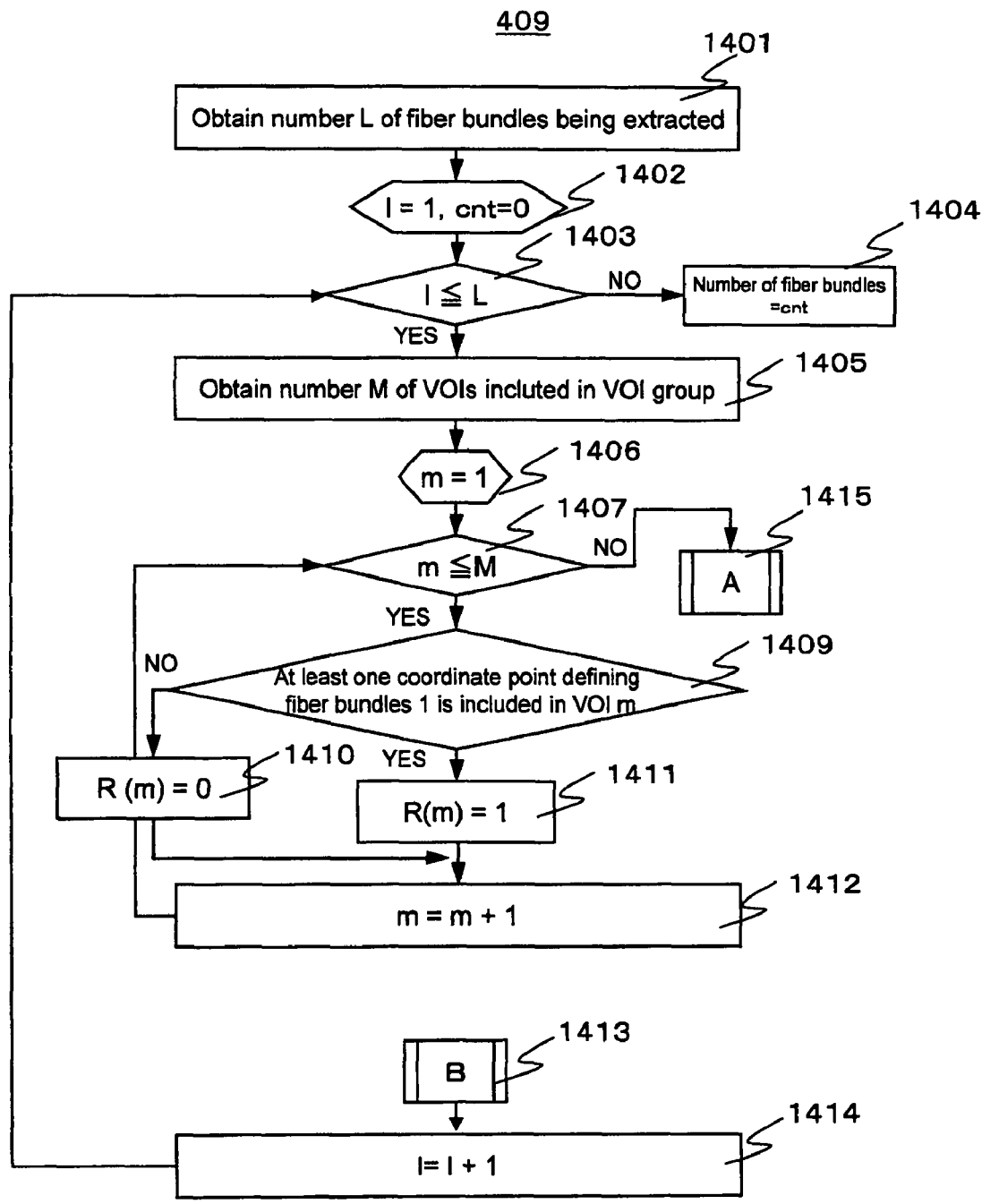
FIG. 7 is a flowchart showing the details of the operation for discriminating the number of fiber bundles in step 409 in FIG. 3.
Figure 8:
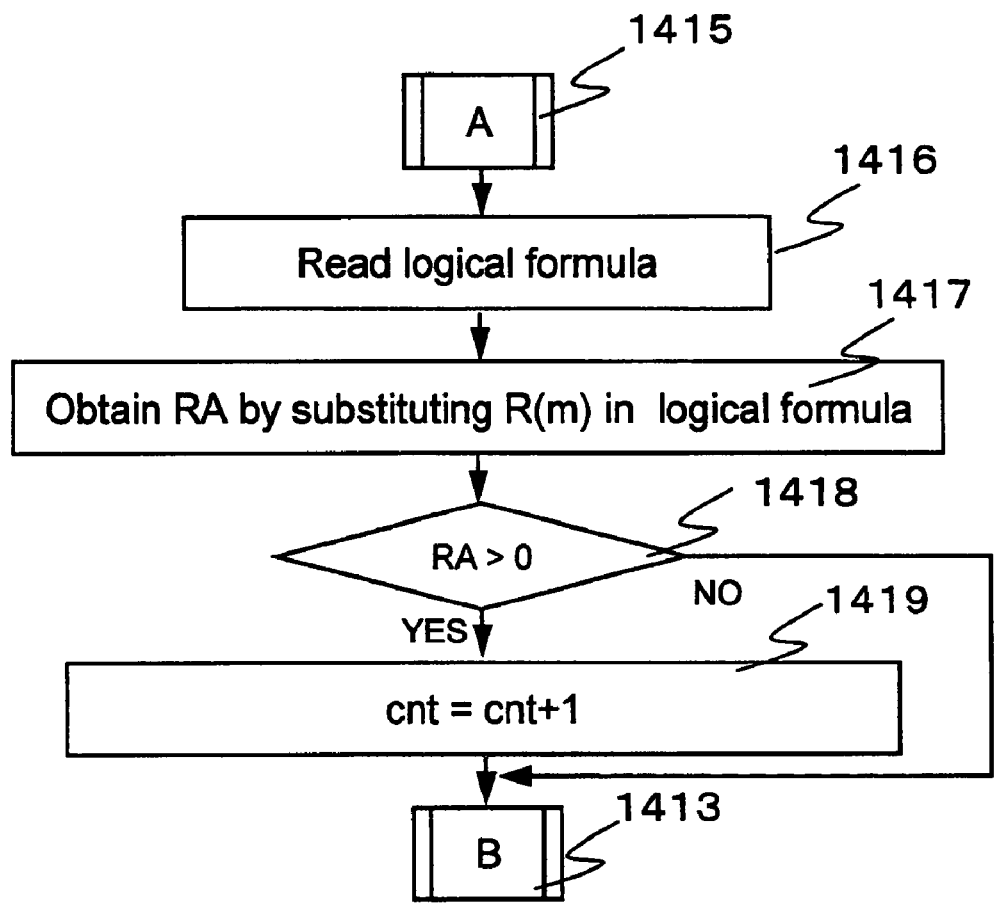
FIG. 8 is a flowchart showing the details of the operation for discriminating the number of fiber bundles in step 409 of FIG. 3.

Next, the operation returns to step 1413 in FIG. 7, and the step 1405 to step 1412 as shown in FIG. 7 and each step of FIG. 8 are performed as to the second fiber bundle (l=2). If the second fiber bundle satisfies the condition of the logical formula, the number of the fiber bundle is counted up. The operation above is performed as to all the fiber bundles (step 1414, step 1403, and step 1404 in FIG. 7). Accordingly, it is possible to count the number of the fiber bundles satisfying the logical formula as to the VOI group A. The fiber bundle number discriminating means 120 performs the above operation for all the VOI groups (A to C) which are set in the VOI selecting means 119.

In step 1416, if the number of the VOI set in the VOI group is one and there is no logical formula being input, RA is set to R(1), whereby the number of fiber bundles passing through this one VOI is counted.

Subsequently, in the comparator 121, the fiber bundle numbers being discriminated by the fiber bundle number discriminating means 120 are compared, and the comparison result is displayed in the display 122 (step 410 and step 411 in FIG. 3). By way of example, comparisons as the following (1) to (4) can be made;

(1) comparing the number of fiber bundles discriminated as being included in the VOI, between one VOI and another, (2) comparing the number of fiber bundles discriminated as being included in the VOI group, between one VOI group and another, (3) the number of the fiber bundles included in the VOI or the number of the fiber bundles included in the VOI group is subjected to a statistical analysis such as analysis of variance (ANOVA), and it is determined whether or not there is a significant difference in the number of fiber bundles between different VOIs, or between different VOI groups, and (4) calculated values by introducing a relative evaluation function that is calculated based on the number of fiber bundles, are subjected to the comparison or the statistical analysis between the VOIs or between the VOI groups.

Figure 9:
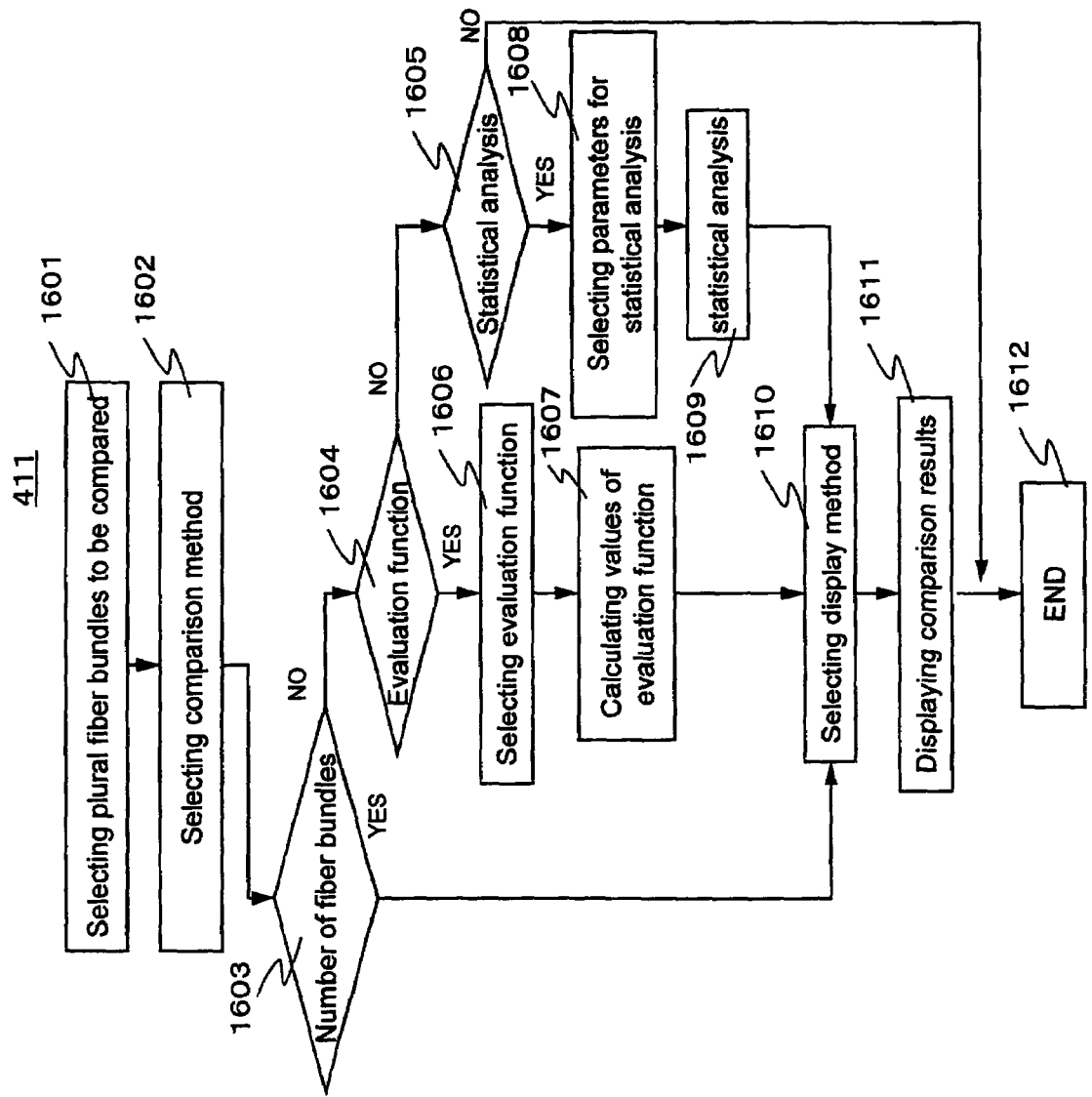
FIG. 9 is a flowchart showing the details of the operation for comparison and for displaying the result thereof in step 411 of FIG. 3.

Specifically, the comparator 121 performs the processing as the flow shown in FIG. 9. Firstly, the comparator 121 displays on the display 122, a display that prompts the operator to select fiber bundles that become comparison targets, and accepts a selection from the operator (step 1601). The fiber bundle being the comparison targets are fiber bundles counted with respect to each VOI group in the fiber bundle number discriminating means 120, and these fiber bundles pass through the neural paths represented by the desired logical formula. The operator selects at least two VOI groups as the comparison targets, and accordingly the fiber bundles can be selected. If the numbers of fiber bundles are compared between two or more VOIs through which the fiber bundles are passing, at least two VOI groups each including only one VOI are selected, and thereby the comparison can be made.

Figure 10:
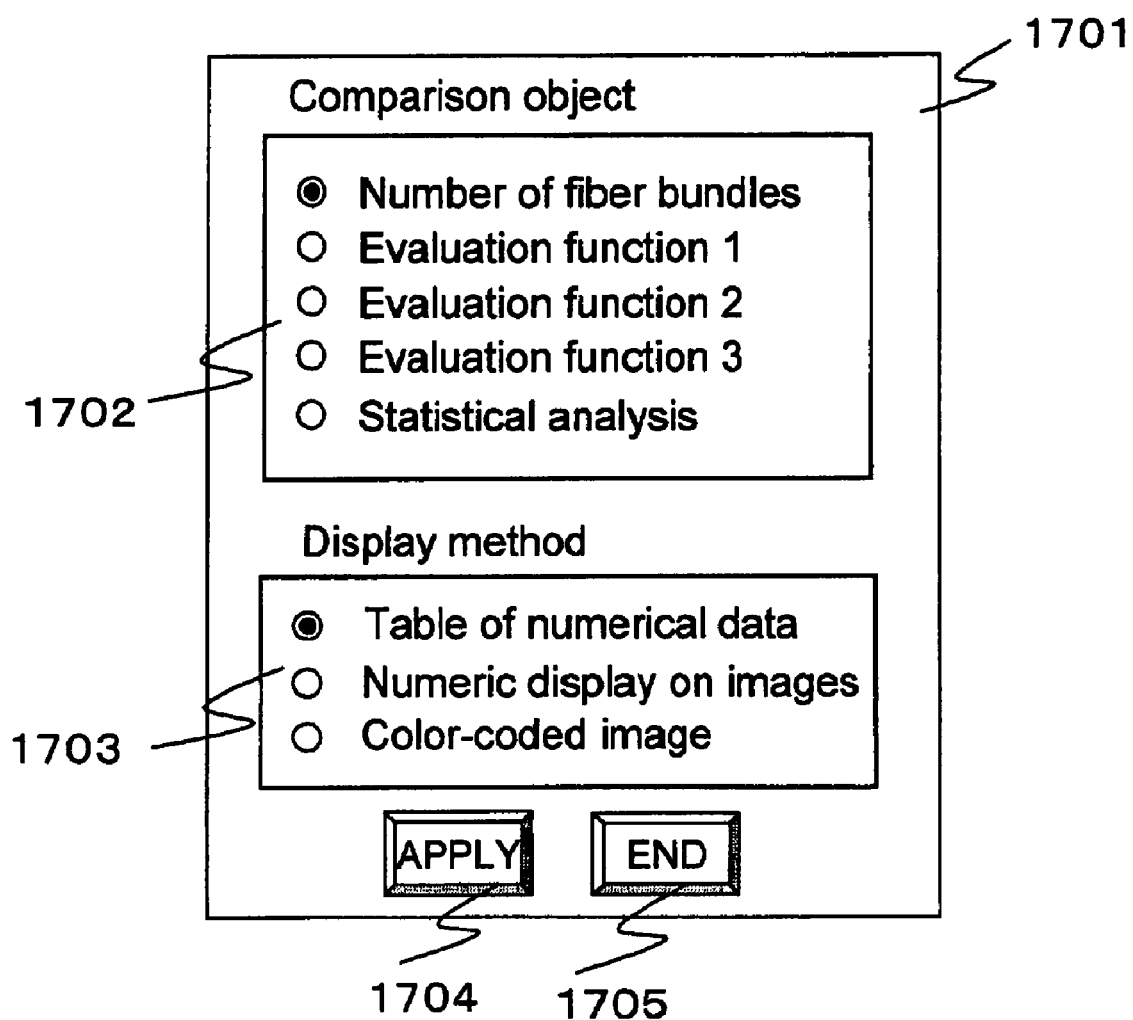
FIG. 10 illustrates a screen example which the comparator 121 displays on the display 122 in the measurement system according of the first embodiment.

Next, the comparator 121 creates a display 1701 on the display 122 as shown in FIG. 10, and the comparison means selection part 1702 and the display method selection part 1703 accepts from the operator a selection of the comparison means and a selection of the display method of the comparison result, respectively. As the comparison means, it is possible to select from; comparison of "fiber bundle numbers", comparison according to any of the predetermined "evaluation functions 1, 2, and 3", and comparison according to a predetermined "statistical analysis". It is possible to select the display method from any of the followings; a method for displaying as a "numerical value table" as shown in FIG. 11A and FIG. 11B, a method for creating a "numerical value display" of the comparison result on an image where a nuclear magnetic resonance image and an image of the coordinate points group representing the fiber bundles are superimposed one on another as shown by the image display part 903 of FIG. 11C, and a method for creating a "color-coded image display" of the comparison result using the colors on the fiber bundles as shown by the image display part 909 of FIG. 11D. The colored display in FIG. 11D is a display method as the following; any of the number of fiber bundles, the evaluation function values, the result of the statistical analysis, and the like, are assigned to the colors in fiber bundles image being displayed, and according to the difference in displayed colors of the fiber bundles, a comparison result is indicated.

If the comparing means accepted in step 1602 is the "the number of fiber bundles", the comparator 121 reads from the fiber bundle number discriminating means 120, each number of fiber bundles in at least two VOI groups (VOIs) being selected (step 1603). If the numerical value table is selected as the display method, a table showing a relationship between the VOI group (VOI) and the number of fiber bundles is displayed as the numerical table 901 shown in FIG. 11A (step 1610 and step 1611). According to the numerical value table 901, it is possible to easily figure out as a numerical value, a difference of the number of fiber bundles among the VOI groups (VOIs). Furthermore, if the "numerical value display on the image" is selected as the display method, positions of the VOIs included in the VOI group and the numbers of fiber bundles respectively pointing at the positions are displayed as shown in FIG. 11C.

Figure 11:
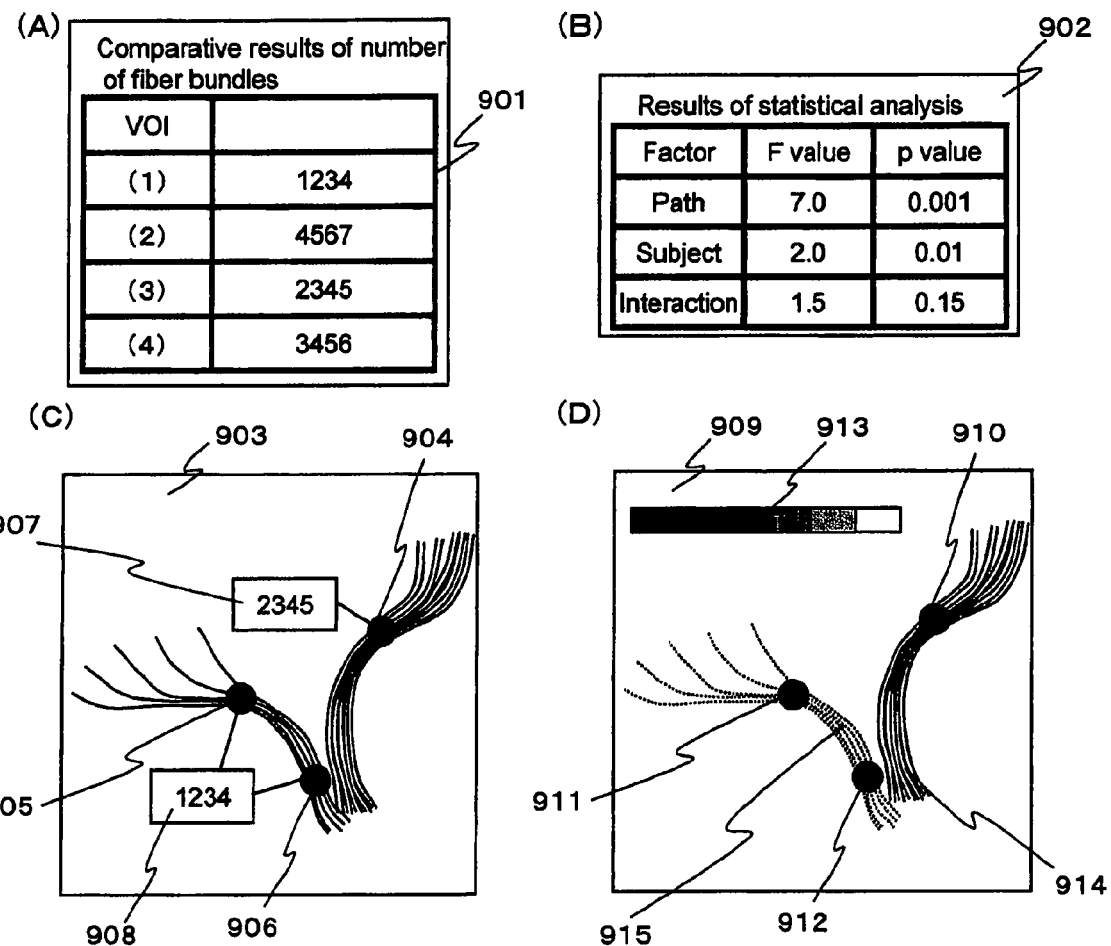
FIG. 11A to FIG. 11D illustrate screen examples which the comparator 121 displays on the display 122, in the measurement system according to the first embodiment.

According to the example as shown in FIG. 11C, it is found that only the VOI 904 is set in one VOI group, and the number of the fiber bundles passing through the VOI 904 is 2,345. In the other VOI group, the number of the fiber bundles passing through both the VOI 905 and the VOI 906 is counted, and the counted number is 1,234. In addition, the positional relationship of the VOIs 904 to 906 and the direction of the fiber bundles are easily figured out. Alternative configuration is possible as the following; when the VOI 904 is clicked by using a pointing device, the number of fiber bundles 907 included in the VOI 904 is displayed, and when the VOI 905 and the VOI 906 are clicked successively, the number of the fiber bundles 908 included in the VOIs 905 and 906 are displayed.

If the "color-coded display" is selected, the numbers of fiber bundles are assigned to the colors of fiber bundles displayed in the image, just like the color-coded display as shown in FIG. 11D, and it is further possible to indicate statistical values by a difference in displayed colors of the fiber bundles. Generally, the data of the fiber bundles has three-dimensional information, and therefore, the image of the fiber bundles can be represented by a three-dimensional image. As shown in FIG. 11D, a color bar 913 is displayed to indicate the assignment of the displayed colors. The displayed images of the fiber bundles 914 included in the VOI 910 and the fiber bundles 915 included in the VOIs 911 and 912, are each decided according to the number of fiber bundles, following the assignment rule of the color bar 913.

If the comparing means accepted in step 1602 in FIG. 9 is "evaluation function" (step 1604), any of the evaluation functions S1, S2, and S3 is read from the built-in memory means, depending on which type of the evaluation function is accepted, 1, 2, or 3 (step 1606). The number of fiber bundles of the VOI group (VOI) being selected are substituted, setting the number of fiber bundles as R1, R2, and RN, and a value of the evaluation function is calculated (step 1607). The calculated value is displayed by the display method being selected (step 1610, and step 1611). When the color-coded display of FIG. 11D is created, the displayed images of the fiber bundles 914 included in the VOI 910 and the fiber bundles 915 included in the VOIs 911 and 912, are each decided according to the evaluation function values, following the assignment rule of the color bar 913.

If the comparing means accepted in step 1602 is the "statistical analysis" (step 1605), a setting of parameters used in the statistical analysis is accepted from the operator (step 1608), and the statistic analysis is conducted. For example, a result of the statistical analysis is displayed, such as p-value (significance probability) and F-value of the analysis of variance, ANOVA. Specifically, the numbers of fiber bundles included in multiple VOIs or in multiple VOI groups are obtained from multiple subjects. Then, the analysis of variance is conducted as to three factors, "VOI (VOI group)", "subject", and "interaction therebetween". Then, p-value, F-value, and the like are calculated, indicating whether or not a difference being statistically significant exists. If there is a statistically significant difference, multiple comparison or the like is made, to find out a combination of factors that shows an actual difference.

The calculated statistical value is displayed in the display method selected by the operator, such as the numerical value table 902 shown in FIG. 11B. According to the result of the statistical analysis, if there is shown a significant difference in the number of fiber bundles between the different VOIs or between the different VOI groups, in each of which the fiber bundles are included, it is also possible to display in different display colors, the VOIs or the VOI groups where there is found a significant difference therebetween, as shown in FIG. 11D. Alternatively, it is possible to display the fiber bundles included in the VOIs or in the VOI groups showing a significant difference, in a color different from the color of the fiber bundles which are included in any other VOI or VOI group.

Figure 12:
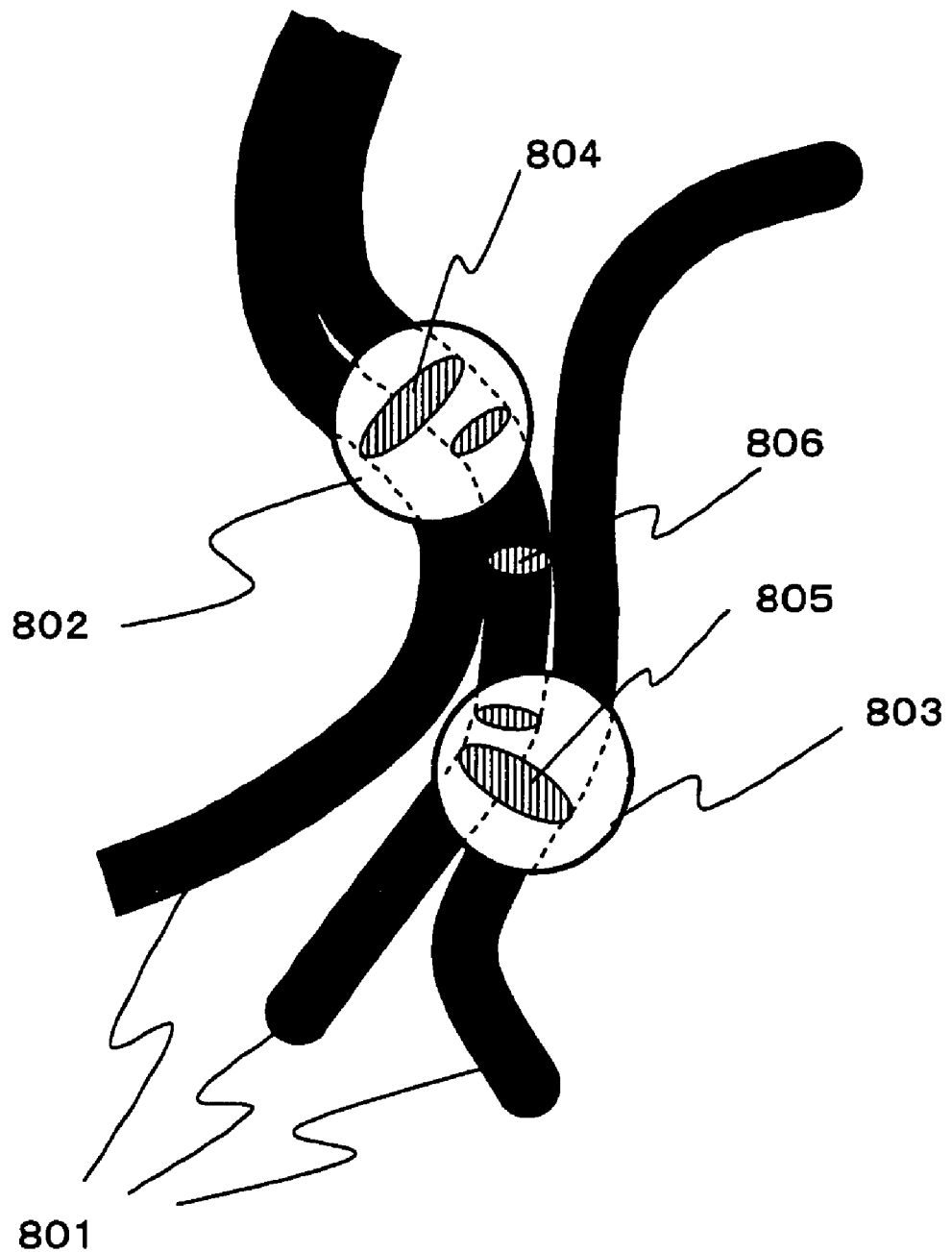
FIG. 12 is an illustration for explaining the evaluation function that the comparator 121 uses in the computation in the measurement system according to the first embodiment.

Here, the evaluation function used in step 1606 and step 1607 will be specifically explained. As the evaluation function, a relative evaluation function can be employed, which is calculated from a ratio between the number of fiber bundles included in the VOI or in the VOI group, and the number of fiber bundles included in another VOI or in another VOI group. An example of the evaluation function will be explained with reference to FIG. 12 and the following formula 6 to formula 8. In FIG. 12, reference numeral 801 indicates fiber bundles, reference numeral 802 indicates VOI (1), and reference numeral 803 indicates VOI (2). The number of fiber bundles passing through the VOI (1) is assumed as R1 (804), the number of fiber bundles passing through the VOI (2) is assumed as R2 (805), and the number of fiber bundles passing through the VOI (1) or the VOI (2) is assumed as Rall (806). Then, using those numbers, the evaluation function is computed. Given the situation above, in the fiber bundle number discriminating means 120, according to the VOI group in which only the VOI (1) is set, and the VOI group in which only the VOI (2) is set, the number of fiber bundles R1 passing through the VOI (1) (804) and the number of fiber bundles R2 passing through the VOI (2) (805) are counted. According to the VOI group, in which the VOIs (1) and (2) are set and the logical formula RA=R(1)+R(2) is set, the number of fiber bundles Rall passing through at least one of the VOIs (1) and (2) is counted. Using the results above, the evaluation function is computed.

As an example of the evaluation function, S1 can be used, which is obtained by dividing Rall by the mean value of R1 and R2, as shown in the formula 6. In the formula 6 to formula 8, N represents the number of the VOIs, and N is set to two in the present embodiment.

$$S1 = \frac{R_{all}}{\text{mean}(R_1, R_2, \ldots, R_N)} \quad \text{[FORMULA 6]}$$

In another example of the evaluation function, Rall is divided by the minimum value either R1 or R2, and obtained S2 can be employed.

$$S2 = \frac{R_{all}}{\min(R_1, R_2, \ldots, R_N)} \quad \text{[FORMULA 7]}$$

As further alternative example of the evaluation function, S3 can be used, which is obtained by calculating a mean value of the ratio between Rall and R1, and the ratio between Rall and R2.

$$S3 = \text{mean}\left(\frac{R_{all}}{R_1}, \frac{R_{all}}{R_2}, \ldots, \frac{R_{all}}{R_N}\right) \quad \text{[FORMULA 8]}$$

Here, the explanation has been made in the case where N=2, however, the present invention is not limited thereto and a similar evaluation function can be used in the case where N=3 or more.

By using the evaluation function as described above, it is possible to evaluate connectivity, which cannot be evaluated properly if the numbers of the fiber bundles are directly compared. For example, when the numbers of neural fiber bundles connecting particular areas in a white matter are compared between individuals, it is anticipated that a proper evaluation result cannot be obtained by the direct comparison of the neural fiber bundles, because there is an individual difference in the degree of brain nerve development. However, by introducing a relative evaluation function, which is calculated from the number of fiber bundles, and by comparing the values of the evaluation function, instead of the number of the fiber bundles directly, thereby enabling a proper evaluation excluding influence from the individual difference. By way of example, in the case of the white matter, a relative evaluation function calculated from the ratio between the number of fiber bundles included in the "VOI or VOI group", and the number of fiber bundles included in "another VOI or another VOI group" can be employed. An example of the above "another VOI" may be the whole white matter, or the whole white matter excluding "the VOI or the VOI group", for instance.

As described above, according to the measurement system of the present embodiment, the fiber bundles passing through the VOI set by the operator, or the fiber bundles passing through multiple VOIs under the condition represented by the logical formula, are discriminated and the number thereof can be counted. The fiber bundles being counted can be compared using the number of fiber bundles, the evaluation function, or the statistical analysis, and then displayed. Accordingly, it is possible to make a quantitative comparison as to the fiber bundles passing through any VOI, as well as a quantitative comparison as to the connectivity of the fiber bundles which are connecting any VOIs.

A clinical application example of the measurement system of the present embodiment will be explained. Here, an explanation will be made as to an example where a part of pyramidal tract is damaged due to cerebral infarction or the like, and connectivity of the fiber bundles is checked against a patient who is suffering from dyskinesia, so that an optimum rehabilitation can be selected.

The pyramidal tract is a neural path that delivers a motor command from the cerebral cortex of the motor area, via the capsula interna, brainstem, spinal cord, and peripheral nerve, up to a muscle periphery, and the pyramidal tracts on the left and right sides crosses each other at the medulla oblongata of the brainstem part. Therefore, it is known that a lesion on the part upper than the medulla oblongata may cause a disorder of upper and lower extremities on the opposite side, and a lesion on the part lower than the medulla oblongata may cause such disorder on the same side. When a patient who is suffering from dyskinesia due to damage on a part of the pyramidal tract, caused by the cerebral infarction or the like, and undergoing rehabilitation, it is expected that the brain activity against an exercise load is changed, at the stage where the motor function is gradually recovered by the rehabilitation. Therefore, if the change of the brain activity is monitored and its result can be given as a feedback, it is expected that the patient is encouraged and a more efficient rehabilitation effect can be achieved.

However, depending on the damaged position and its degree of damage, a portion where the brain activity is to be monitored may be different. In other words, if it is damaged to a slight degree, the patient may recover from dyskinesia, when the brain function of the lesion portion recovers. However, if the pyramidal tract is severely damaged, it is not possible to recover the brain function of the lesion portion, and this may give rise to the phenomenon that a part different from the portion originally supposed to act, substitutes for the brain function being damaged. Accordingly, there is a possibility that a process of recovering of the brain function may be different, and also a menu for an optimum rehabilitation may be different.

Figure 13:
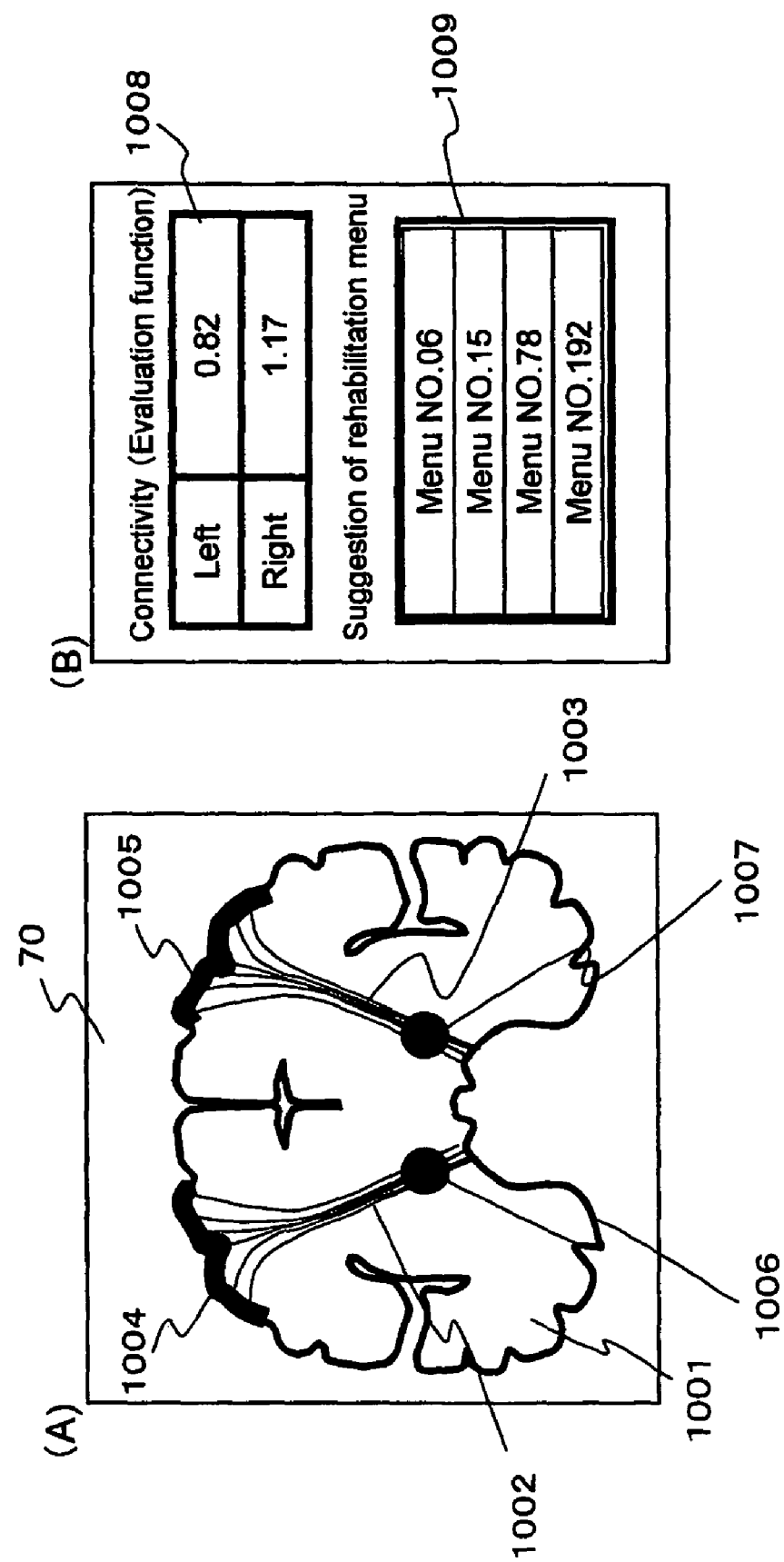
FIG. 13A illustrates an example of the overall coronal image in the case where the connectivity of the pyramidal tracts is measured by using the measurement system according to the first embodiment.
FIG. 13B illustrates a screen example that represents the connectivity being measured and a proposal of rehabilitation menu.

Given the situation above, by using the measurement system of the present embodiment, it is measured at which position of the pyramidal tract and to what degree it is damaged, whereby it helps specifying in which part the brain activity is to be monitored, enabling a customization of an optimum rehabilitation method. The situation above will be specifically explained, with reference to FIG. 13A and FIG. 13B.

Firstly, according to step 401 to 407 in FIG. 3, the fiber bundles in the coronal section of the brain are extracted. In step 408, the VOI selecting means 119 displays an image of a coronal image 1001 in the image display part 701, and accepts a specification of the VOI from the operator. Here, in order to obtain the connectivity between the left and right pyramidal tracts 1002 and 1003, for example, a VOI group made up of a VOI (1) 1004 selected on the cerebral cortex of the motor area and a VOI (2) 1006 selected in the area containing the capsula interna, and a VOI group made up of the VOI (1) 1005 and the VOI (2) 1007, are set respectively for the left and right sides of the brain. For each of the VOI groups, the logical formula RA=R(1)×R(2), so as to find the fiber bundles passing through both the VOI (1) and the VOI (2).

Subsequently, in the fiber bundle number discriminating means 120, the number of the fiber bundles included in the VOI groups is obtained. According to a directive from the operator, a value of relative evaluation function is calculated based on the number of fiber bundles. In the comparator 121, based on the number of the fiber bundles or the value of the relative evaluation function, a difference of connectivity between the left and right pyramidal tracts is calculated. The comparator 121 displays, in the display 122, values of the evaluation function that indicates the connectivity between the left and right pyramidal tracts, according to the numerical table 1008.

The comparator 121 uses the predetermined threshold values A and B (A<B) to make a judgment as the following; when the difference in connectivity between the left and right pyramidal tracts 1002 and 1003 is smaller than the threshold value A, the damage is mild, when it is equal to or larger than the threshold value A and smaller than the threshold B, the damage is moderate, and when it is equal to or larger than the threshold value B, the damage is serious. According to the degree of the damage, a predetermined rehabilitation menu is assigned, and it is displayed in the display 122 in the form of table 1009. Here, it is to be noted that without using the threshold value, the degree of the damage may be assigned to sequential values according to the value of the connectivity. It is further possible that in response to the result such as the connectivity value and the difference in connectivity, an optimum portion for monitoring the brain activity, being previously determined, is assigned and this portion to be monitored is displayed for the operator.

As thus described, by using the measurement system according to the present embodiment, it is possible to make a quantitative comparison as to the number of fiber bundles (connectivity) passing through given neural paths (e.g., pyramidal tract), and therefore, a damaged position in the brain can be figured out and a suitable rehabilitation menu can be suggested.

The first embodiment of the present invention is directed to a configuration where the operator inputs a logical formula form, representing under which condition the fiber bundles to be discriminated and counted, are passing through multiple VOIs included in the VOI group. However, the present invention is not limited to the configuration where the logical formula is input. Another configuration is possible, for instance, in the operation screen 706 in FIG. 5B, there is provided a "condition setting button". Using this button, the operator is allowed to select a condition, from the condition (AND) that the fiber bundles pass both two VOIs, the condition (OR) that the fiber bundles pass either one of the two VOIs, and the condition (NOT) that the fiber bundle passing the VOI is excluded, together with a VOI to which the selected condition is applied.

Second Embodiment

As a second embodiment, a measurement system will be explained, which is provided with a function to set the VOI to an optimum size. In the configuration of the measurement system according to the second embodiment, a function for setting the VOI with an optimum size is added to the VOI selecting means 119, but the configuration and operations are the same as the measurement system of the first embodiment. Therefore, hereinafter, among the operations of the VOI selecting means 119 and the fiber bundle number discriminating means 120, only a part different from the first embodiment will be explained, and the operations and the configuration being the same as the first embodiment will not be tediously explained.

It is anticipated that the size of the VOI may influence the number of fiber bundles, a value of relative evaluation function, and their comparison result. Therefore, it is desirable to select a size of the VOI that hardly influences these values. In the present embodiment, as to the VOI of various sizes (volumes), the number of fiber bundles and the value of the evaluation function are calculated, and these results or comparison results are displayed, thereby allowing the operator to select a size of the VOI that is optimum. Here, with reference to FIG. 14 and FIG. 15, an operation for setting various sizes of the VOI will be explained.

Figure 14:
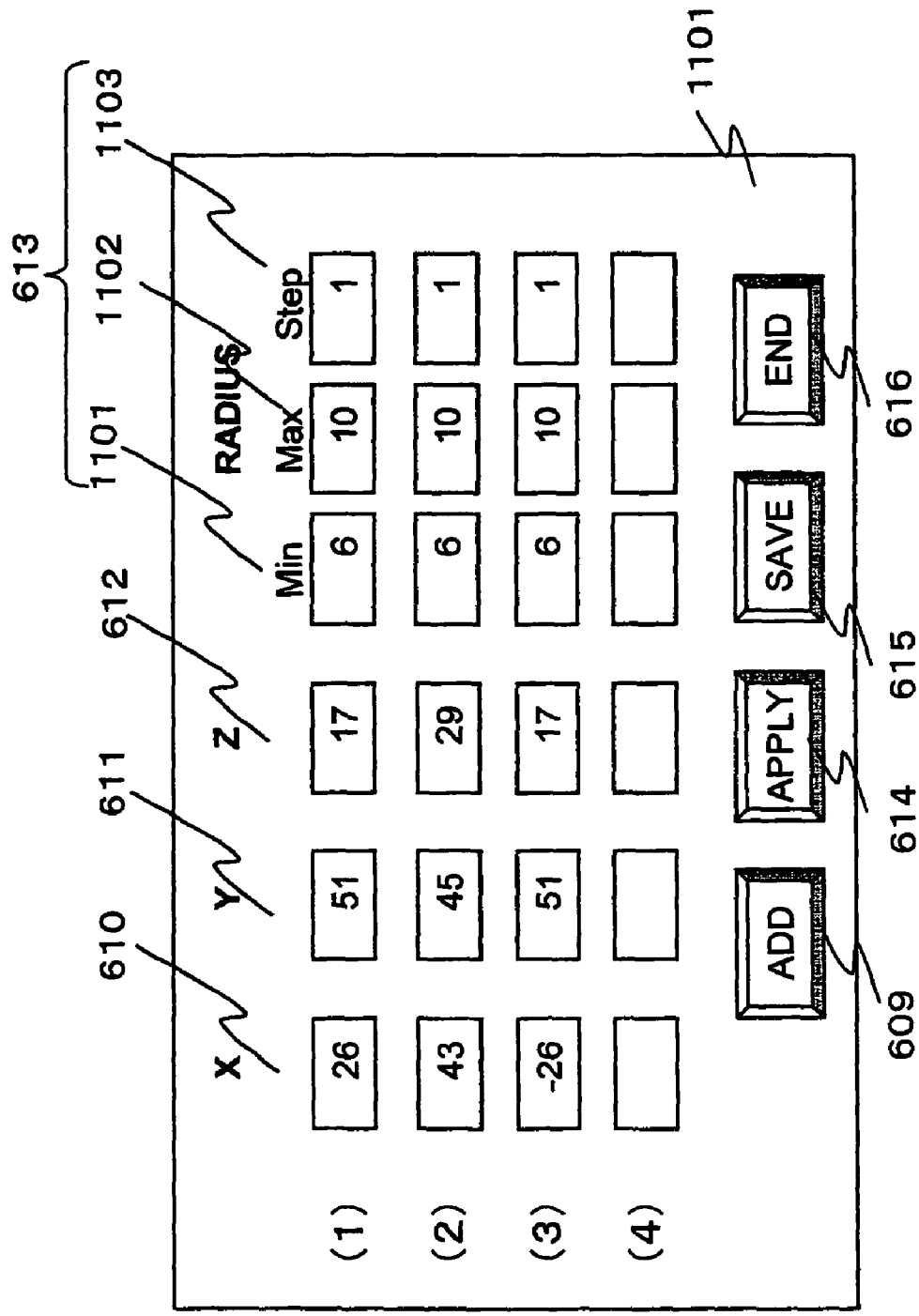
FIG. 14 illustrates an example of displayed screen for accepting specification of VOIs in the measurement system according to the second embodiment.

In step 1308 of FIG. 4, if the "TEXT ENTRY" is selected on the VOI parameter input part 603 shown in FIG. 6A, the text input screen 1101 shown in FIG. 14 is displayed in the display 122. Here, an explanation will be made as to the case where a spherical area is specified by the text input. In the text input screen 608 for the spherical area, the "ADD" button 609 for the area is pressed, and then, the parameter input part is displayed for inputting new parameters for VOI (1)-(4), which includes an input part for a central coordinate in the X-direction 610, an input part for a central coordinate in the Y-direction 611, an input part for a central coordinate in the Z-direction 612, and an input part for radius 613. The input part for radius 613 includes a minimum radius value input part 1102, a maximum radius value input part 1103, and a radius step input part 1104.

In the minimum radius value input part 1102, a minimum radius value of the VOI is input, among multiple VOI volumes desired by the operator. In the maximum radius value input part 1103, a maximum radius value of the VOI is input, among multiple VOI volumes desired by the operator. In the radius step input part 1104, the amount of change of the VOI radius is input. With the inputs as described above, it is possible to determine the coordinates of the center of the VOI and what kind of radius the VOI has.

After the above inputting is completed for the text input screen 1101, the "APPLY" button 614 is pressed and thereby the VOI is set in the VOI selecting means 119. In addition, by pressing the "SAVE" button 615, the combination of the coordinates constituting the VOI, and the minimum and maximum values of radius, and the amount of change thereof are stored in the memory means of the VOI selecting means 119.

As to the VOIs having various types of radius set in the VOI selecting means 119, the fiber bundle number discriminating means 120 discriminates the fiber bundles respectively passing through the VOIs having various types of radius, and counts the number thereof, similar to the case where one VOI is set in the VOI group in the flows shown in FIG. 7 and FIG. 8 according to the first embodiment. It is further possible to obtain a value of the relative evaluation function. The fiber bundle number discriminating means displays in the display 122, a numerical table 1201 in which values of the evaluation function (or the numbers of fiber bundles) are compared, as shown in FIG. 15. The numerical table 1201 is provided with the VOI number display part 1202 and the VOI radius display part 1203, and values of the relative evaluation function are displayed for the case where various types of radius are set with respect to each VOI. Therefore, referring to the display result of the numerical table 1201, the operator can select an optimum range of radius of the VOI, according to his or her self-judgment.

In addition, the VOI selecting means 119 is also capable of providing information to help the judgment, when the operator selects the optimum radius of the 2VOI. By way of example, the VOI selecting means 119 sequentially executes the following computations, thereby obtaining information for helping the judgment;

(1) a mean value of the values in each column, i.e., a mean value of the evaluation function values with respect to each radius is obtained, in the numerical table 1201 in which values of the evaluation function are compared, (2) values are obtained by dividing each of the evaluation function values in the numerical table 1201, by the mean value obtained in the above (1) for each column to which the evaluation function value belongs, (3) as to the values obtained in the above (2), a mean value is obtained with respect to each VOI, (4) as to the values obtained by the above (2), a difference from the mean value for each VOI obtained in (3) is calculated to obtain its absolute value, (5) the value obtained in (4) is compared with a threshold value predetermined for each radius, and if there is no VOI having a value that exceeds the threshold value, it is determined that the value of radius is within the optimum range, and the value of the threshold value may be set to 0.1, for instance; and (6) the column of the numerical table 1201 having the radius determined as being within the optimum range may be displayed in such a manner as being colored, thereby allowing the operator to recognize that the radius is within the optimum range.

With the procedure above, the operator is allowed to select an optimum radius, according to the numerical values in the numerical table 1201 displayed on the display 122 and the coloring that represents the optimum range. Alternatively, the operator may choose an automatic selection setting, and the radius which the VOI selecting means 119 has determined as the optimum range can be automatically set without waiting the selection by the operator.

In the case of the automatic setting, the VOI selecting means 119 automatically sets the radius selected by the operator or the radius within the optimum range, as the radius of the VOI, and the fiber bundle number discriminating means 120 and the comparator 121 perform the discrimination and comparison of the number of fiber bundles, and display thereof, similar to the first embodiment (step 409 to step 411 in FIG. 3).

As thus described, according to the measurement system of the second embodiment, it is possible to set the VOI to an optimum size, which has little effect upon the number of fiber bundles, a value of the relative evaluation function, and the comparison result thereof. Therefore, the effect due to the size of the VOI is reduced, and more accurate quantitative evaluation is possible as to the number of fiber bundles and their connectivity.

Third Embodiment

Figure 16:
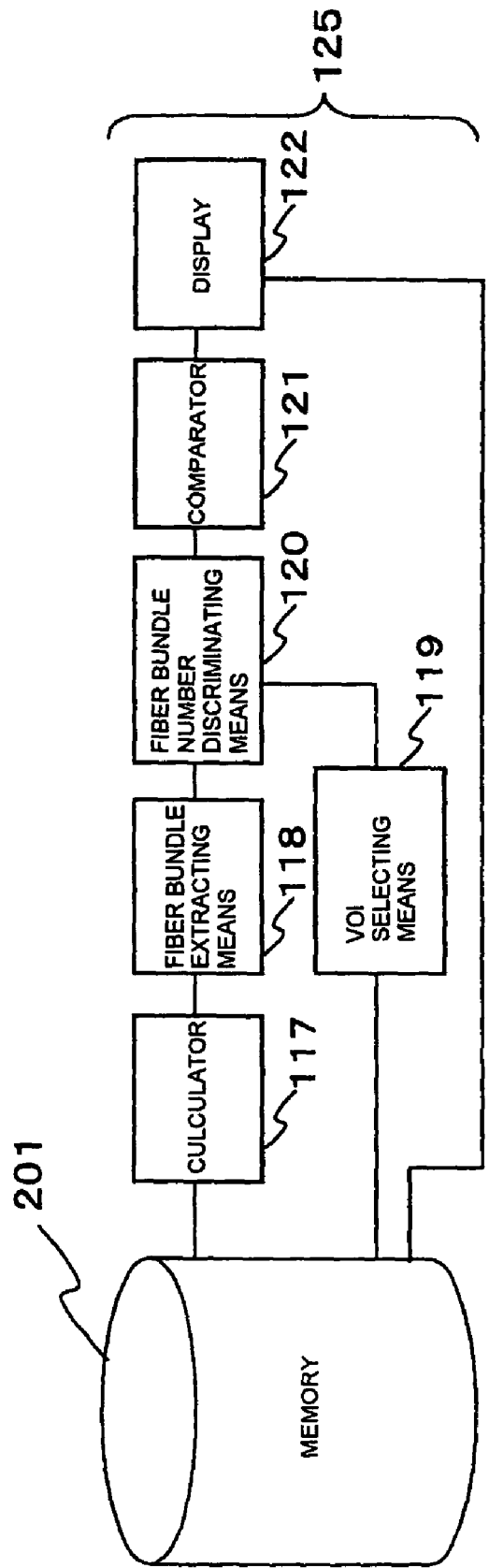
FIG. 16 is a block diagram showing an overall configuration of the image processing system relating to the third embodiment.

Next, an image processing system according to the third embodiment will be explained, with reference to FIG. 16 and FIG. 17. As shown in FIG. 16, this image processing system is provided with an image processor 125 having the same configuration as the measurement system according to the first embodiment. However, unlike the measurement system of the first embodiment, it is not provided with a nuclear magnetic resonance imager, but instead, it is provided with a memory means 201 for storing the nuclear magnetic resonance image.

Since the configuration of the image processor 125 is the same as the first embodiment, tedious explanation will not be made. The memory means 201 stores a diffusion-weighted image that is separately taken. Similar to the first embodiment, as the diffusion-weighted image, nuclear magnetic resonance images using a combination of at least six different MPGs, and a nuclear magnetic resonance image obtained without applying the MPG are stored.

Figure 17:
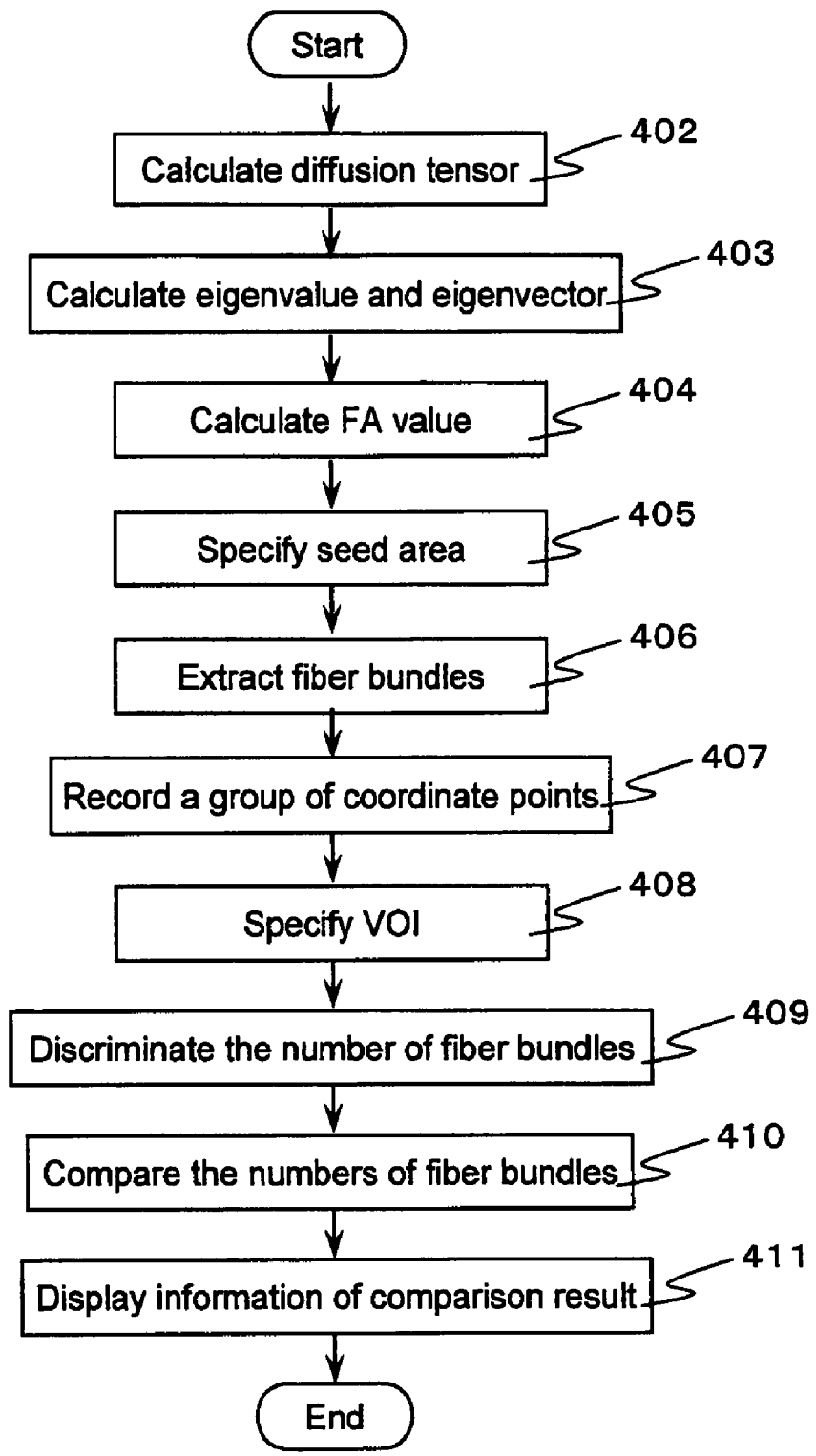
FIG. 17 is a flowchart showing the operations of the image processing system according to the third embodiment.

As indicated by the flow shown in FIG. 17, the operations of this image processing system are the same as the step 402 to step 411 of the measurement system of the first embodiment as indicated by the flow shown in FIG. 3. However, in step 402 where the diffusion tensor is calculated, the calculator 117 calculates diffusion tensor from the nuclear magnetic resonance image stored in the memory 201.

According to the image processing system of the third embodiment, it is possible to quantitatively figure out the number of fiber bundles in the VOI and the connectivity between the VOIs, by using the diffusion-weighted images that is taken separately, without the nuclear magnetic resonance imager being incorporated.

It is further possible that the image processing system according to the third embodiment is provided with the function to set the VOI to an optimum size, which is explained as the second embodiment.

Fourth Embodiment

As the fourth embodiment, a computer that implements the image processing function will be explained. In the first and the third embodiments, the calculator 117, the fiber bundle extracting means 118, the discriminating means for fiber bundles 120, the comparator 121, and the VOI selecting means 119 are separately configured, which are incorporated in the image processing means 125. However, in the fourth embodiment, a CPU of the computer reads and executes programs, thereby performs the same function as those of the calculator 117, the fiber bundle extracting means 118, the fiber bundle number discriminating means 120, the comparator 121, and the VOI selecting means 119.

Figure 18:
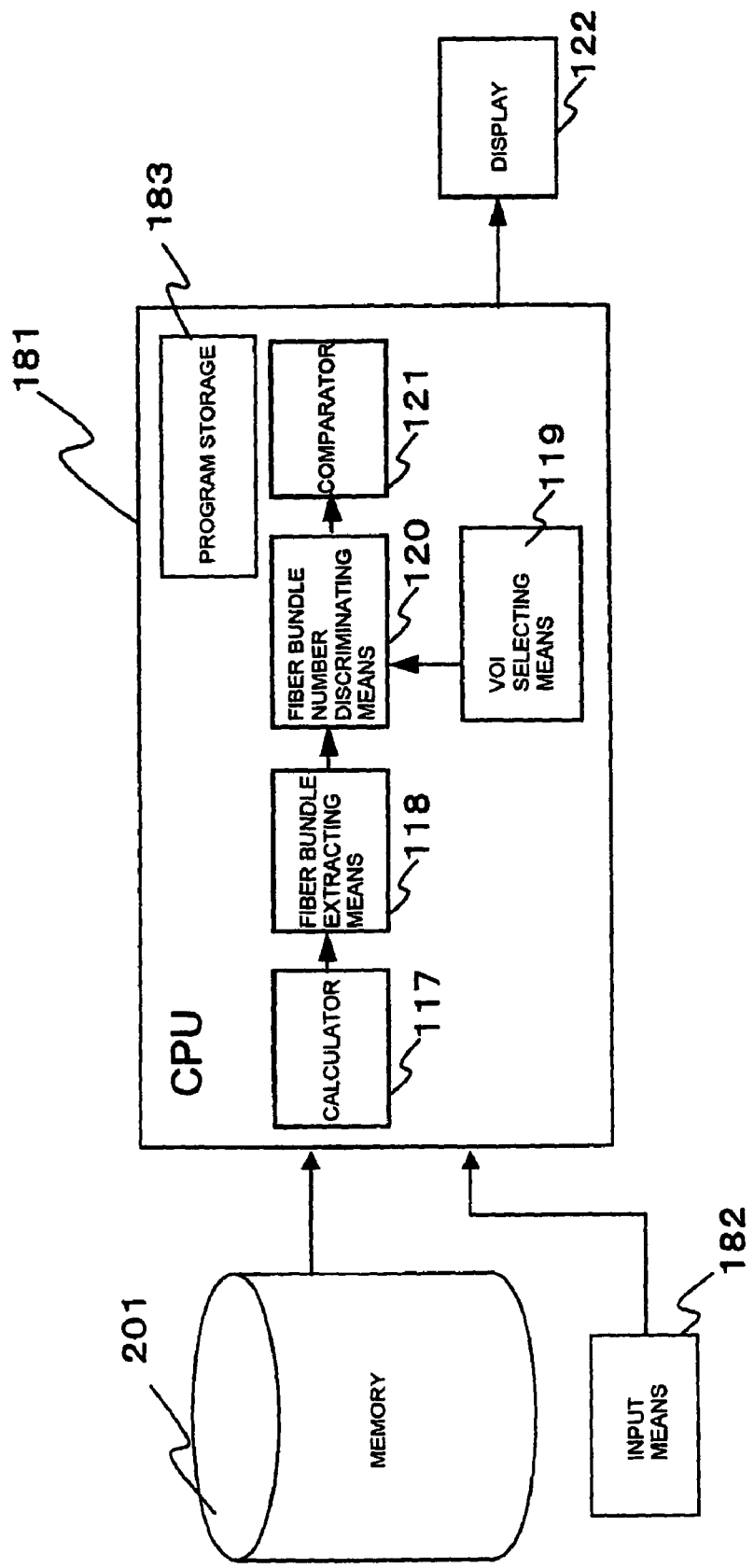
FIG. 18 is a block diagram showing an overall configuration of the image processing system relating to the fourth embodiment.

As shown in FIG. 18, the computer according to the fourth embodiment includes the CPU 181, the input means 182, the display 122, and the memory means 201. The CPU 181 incorporates a program storing means 183, and the program storing means 183 that previously stores programs to implement the operations of the calculator 117, the fiber bundle extracting means 118, the fiber bundle number discriminating means 120, the comparator 121, and the VOI selecting means 119. The memory means 201 previously stores diffusion-weighted images separately taken, similar to the third embodiment. The input means 182 is a portion to accept from the operator, specification of a VOI, selection of a condition, and the like.

The CPU 181 reads and executes the programs within the program storing means 183, whereby the functions of the calculator 117, the fiber bundle extracting means 118, the fiber bundle number discriminating means 120, the comparator 121, and the VOI selecting means 119 are performed, and these operations are executed. Specifically, the processing in the steps from step 402 to 411 shown in FIG. 17 is executed. Since the contents of the processing from step 402 to step 411 are the same as the processing explained in the first embodiment and in the third embodiment, the explanation thereof will be omitted.

The hardware configuration of the computer having the image processing function of the fourth embodiment is the same as the configuration of a commercially available personal computer, or the like, and by storing the programs and allowing the computer to execute the programs, the operations similar to those of the image processing system according to the third embodiment can be implemented.

Also in the measurement system according to the first embodiment, the image processor 125 may have the same configuration as the computer of the fourth embodiment.

By using the measurement system and the image processing system according to the first to the fourth embodiments described above, the number of neural fiber bundles within a particular area and the connectivity of the neural fiber bundles between the areas are measured, and thereby the state of the neural fiber bundles can be figured out quantitatively. Therefore, there is a possibility that customization for an optimum rehabilitation method can be implemented. With the configuration above, it is possible to monitor a change of the brain activity of a damaged-brain patient who is a rehabilitant, and to feedback a result of the monitoring, expecting to obtain more efficient rehabilitation effect, even in the case where a degree of recovery of the brain function is different by patient depending on the state of the surviving neural fiber bundles, and an optimum rehabilitation method is different by patient.

By using the measurement system and the image processing system according to the first to the fourth embodiments, the connectivity between particular brain areas can be quantitatively evaluated. Therefore, if a relationship between the connectivity of particular brain areas and a specific ability is figured out in the future brain science research, the present invention may be applied to a development of learning-effect monitoring tool and a support tool for development of educational materials, in order to foster this ability.

In each of the above embodiments, neural fiber bundles of a brain have been taken as an example. However, a target for the measurement and the image processing in the measurement system and the image processing system of the present invention is not restricted to the brain. Measurement and image processing of muscle fibers existing in the muscle are also available. With the application above, the present invention may be useful for monitoring a rehabilitation effect on a patient whose muscle is damaged.

What is claimed is:

1. An NMR measurement system which obtains an optimum range of a VOI (Volume Of Interest) size, comprising:
   a magnetic field application means for applying a static magnetic field and a radio frequency field to a subject;
   a receiving means for receiving a nuclear magnetic resonance signal from the subject;
   a calculating means for calculating a diffusion tensor from the nuclear magnetic resonance signals;
   a fiber bundle extracting means for extracting fiber bundles as a group of coordinate points that represents each of the fiber bundles included in a target range which receives the nuclear magnetic resonance signal from the subject, based on the diffusion tensor calculated by the calculating means;
   a VOI selecting means for setting at least one VOI within the target range which receives the nuclear magnetic resonance signal;
   a fiber bundle number discriminating means for discriminating the fiber bundles which have at least one coordinate point of the group of coordinate points included in the VOI, from the fiber bundles extracted by the fiber bundle extracting means, and configured for counting the number of the fiber bundles; and where
   the VOI selecting means arranges various sizes of VOIs, allows the fiber bundle number discriminating means to count the number of the fiber bundles included in each of the various sizes of VOIs, and performs a predetermined computation as to the number of fiber bundles of the various sizes of VOIs, whereby an optimum range of the VOI size is obtained.

2. The NMR measurement system according to claim 1, wherein,
   the VOI selecting means sets a VOI group including at least one VOI, and a discrimination condition indicating a neural path of the fiber bundles to be discriminated against with respect to the at least one VOI in the set VOI group, and wherein
   the fiber bundle number discriminating means discriminates the fiber bundles and counts the number thereof within the set VOI group, according to the discrimination condition.

3. The NMR measurement system according to claim 2, further comprising
   a comparator configured for comparing the numbers of the fiber bundles with one another, when the VOI selecting means sets at least two of the VOIs or at least two of the VOI groups and wherein the number of the fiber bundles is counted with respect to each of the VOIs or the VOI groups, which have then been set by the VOI selecting means.

4. An NMR image processing system which obtains an optimum range of a VOI (Volume Of Interest) size, comprising:
   a memory means for storing nuclear magnetic resonance signal data previously acquired from a subject;
   a calculating means for calculating a diffusion tensor from the nuclear magnetic resonance signal data;
   a fiber bundle extracting means for extracting fiber bundles as a group of coordinate points that represents each of the fiber bundles included in a target range which receives the nuclear magnetic resonance signal from the subject, based on the diffusion tensor calculated by the calculating means;
   a VOI selecting means for setting at least one VOI within the target range which receives the nuclear magnetic resonance signal;
   a fiber bundle number discriminating means for discriminating the fiber bundles which have at least one coordinate point of the group of coordinate points included in the VOI, from the fiber bundles extracted by the fiber bundle extracting means, and configured for counting the number of the fiber bundles; and where the VOI selecting means arranges various sizes of VOIs, allows the fiber bundle number discriminating means to count the number of the fiber bundles included in each of the various sizes of VOIs, and performs a predetermined computation as to the number of fiber bundles of the various sizes of VOIs, whereby an optimum range of the VOI size is obtained.

5. The NMR image processing system according to claim 4, wherein, the VOI selecting means sets a VOI group including at least one VOI, and a discrimination condition indicating a neural path of the fiber bundles to be discriminated against with respect to the at least one VOI in the set VOI group, and wherein the fiber bundle number discriminating means discriminates the fiber bundles and counts the number thereof within the set VOI group, according to the discrimination condition.

6. The NMR image processing system according to claim 5, further comprising a comparator configured for comparing the numbers of the fiber bundles with one another, when the VOI selecting means sets at least two of the VOIs or at least two of the VOI groups and wherein the number of the fiber bundles is counted with respect to each of the VOIs or the VOI groups, which have then been set by the VOI selecting means.

* * * * *